(12) United States Patent
Stoll et al.

(10) Patent No.: US 10,170,453 B2
(45) Date of Patent: Jan. 1, 2019

(54) ARRANGEMENT AND METHOD FOR GENERATING MIXED LIGHT

(71) Applicant: OSRAM Opto Semiconductors GmbH, Regensburg (DE)

(72) Inventors: Ion Stoll, Tegernheim (DE); Michael Schumann, Neu-Ulm (DE); Ludwig Ploetz, Arnschwang (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 255 days.

(21) Appl. No.: 14/900,142

(22) PCT Filed: Jun. 12, 2014

(86) PCT No.: PCT/EP2014/062268
§ 371 (c)(1),
(2) Date: Dec. 18, 2015

(87) PCT Pub. No.: WO2014/202464
PCT Pub. Date: Dec. 24, 2014

(65) Prior Publication Data
US 2016/0141277 A1    May 19, 2016

(30) Foreign Application Priority Data
Jun. 21, 2013 (DE) .................. 10 2013 106 519

(51) Int. Cl.
| | |
|---|---|
| F21K 9/64 | (2016.01) |
| H01L 25/075 | (2006.01) |
| H01L 33/50 | (2010.01) |
| H05B 33/08 | (2006.01) |
| C09K 11/77 | (2006.01) |
| H05B 33/14 | (2006.01) |
| H01L 33/58 | (2010.01) |

(52) U.S. Cl.
CPC ...... H01L 25/0753 (2013.01); C09K 11/7774 (2013.01); C09K 11/7792 (2013.01);
(Continued)

(58) Field of Classification Search
CPC ......... F21K 9/64; H01L 33/504; H01L 33/58; H01L 25/0753; H01L 2924/0002;
(Continued)

(56) References Cited

U.S. PATENT DOCUMENTS

| | | |
|---|---|---|
| 2005/0030416 A1 | 2/2005 | Kametani et al. |
| 2006/0126326 A1 | 6/2006 | Ng et al. |

(Continued)

FOREIGN PATENT DOCUMENTS

| | | |
|---|---|---|
| DE | 102008025864 A1 | 12/2009 |
| DE | 102010046300 A1 | 4/2012 |

(Continued)

OTHER PUBLICATIONS

Ye, S. et al.: "Phosphors in phosphor-converted white light-emitting diodes: Recent advances in materials, techniques and properties", Materials Science and Engineering R, 71, 2010, pp. 1-34.

*Primary Examiner* — Y M Lee
(74) *Attorney, Agent, or Firm* — McDermott Will & Emery LLP

(57) ABSTRACT

The invention relates to an arrangement for generating mixed light, which comprises three semiconductor chips, emitting in the blue spectral range, of three devices. Arranged in the light paths of the individual semiconductor chips are different conversion elements which are configured to convert primary radiation into secondary radiation. The total radiation (S1, S2, S3) exiting the respective devices (10, 20, 30) has a corresponding chromaticity coordinate on the black body curve of the CIE color diagram 1931 or lies within a color quadrilateral of the CIE color diagram.

17 Claims, 11 Drawing Sheets

Figure 1:
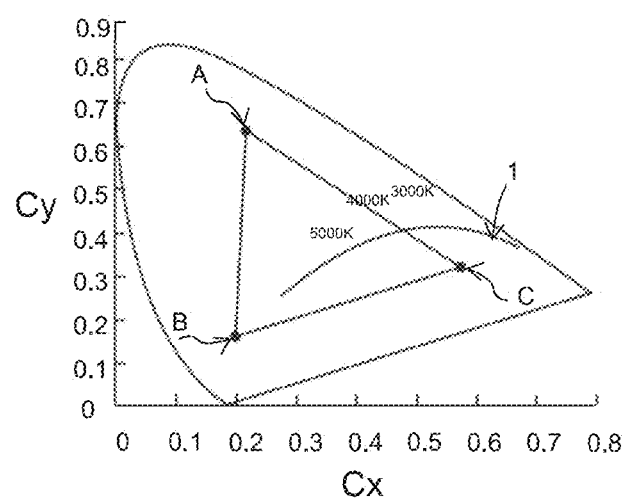

(52) U.S. Cl.
CPC .............. *F21K 9/64* (2016.08); *H01L 33/504* (2013.01); *H01L 33/58* (2013.01); *H05B 33/0857* (2013.01); *H05B 33/14* (2013.01); *H01L 2924/0002* (2013.01)

(58) Field of Classification Search
CPC .............. H01L 33/502; C09K 11/7774; C09K 11/7792; H05B 33/0857; H05B 33/14
See application file for complete search history.

(56) References Cited

U.S. PATENT DOCUMENTS

| | | |
|---|---|---|
| 2008/0238335 A1 | 10/2008 | Lee et al. |
| 2009/0002604 A1 | 1/2009 | Morimoto |
| 2009/0008655 A1 | 1/2009 | Peeters et al. |
| 2010/0207134 A1 | 8/2010 | Tanaka et al. |
| 2011/0121758 A1* | 5/2011 | Bierhuizen .............. F21K 9/00 315/294 |
| 2011/0133654 A1* | 6/2011 | McKenzie ................ F21K 9/00 257/89 |
| 2012/0001555 A1 | 1/2012 | Tu et al. |
| 2012/0326627 A1 | 12/2012 | McDaniel, Jr. |
| 2014/0210368 A1* | 7/2014 | Lee ...................... G02B 6/0068 315/192 |

FOREIGN PATENT DOCUMENTS

| | | |
|---|---|---|
| DE | 102011013504 A1 | 9/2012 |
| EP | 2490258 A2 | 8/2012 |
| WO | 2013/038579 A1 | 3/2013 |
| WO | 2015/052238 A1 | 4/2015 |

\* cited by examiner

ARRANGEMENT AND METHOD FOR GENERATING MIXED LIGHT

The invention relates to an arrangement for generating mixed light and a method for operating an arrangement for generating mixed light.

An arrangement for generating mixed light having a corresponding chromaticity coordinate is to be provided. In particular, an arrangement for generating mixed light is to be provided, which is suitable for use as a flash light in cameras and/or mobile telephone cameras. Furthermore, a method for operating an arrangement of mixed light is to be provided.

These objects are achieved by the subject matter having the features of the independent claim. Advantageous embodiments and developments are provided in the dependent claims.

According to one embodiment, an arrangement for generating mixed light comprises a first device having a first semiconductor chip for generating a first primary radiation in the blue spectral range and having a first conversion element for generating a first secondary radiation from the first primary radiation, wherein a first total radiation exiting the first device has a first chromaticity coordinate on the black body curve of the CIE color diagram 1931 having a deviation of at the most 0.02 and having a color temperature of 6,500 K to 4,500 K or lies within a color quadrilateral having the corner points (0.285, 0.345), (0.285, 0.500), (0.390, 0.500) and (0.390, 0.345), a second device having a second semiconductor chip for generating a second primary radiation in the blue spectral range and having a second conversion element for generating a second secondary radiation from the second primary radiation, wherein a second total radiation exiting the second device has a second chromaticity coordinate on the black body curve having a deviation of at the most 0.02 and having a color temperature of 20,000 K to 10,000 K or lies within a color quadrilateral having the corner points (0.300, 0.225), (0.375, 0.225), (0.300, 0.340) and (0.475, 0.340), a third device having a third semiconductor chip for generating a third primary radiation in the blue spectral range and having a third conversion element for generating a third secondary radiation from the third primary radiation, wherein a third total radiation exiting the third device has a third chromaticity coordinate on the black body curve having a deviation of at the most 0.02 and having a color temperature of 3,500 K to 2,500 K or lies within a color quadrilateral having the corner points (0.425, 0.400) and (0.525, 0.400) and (0.425, 0.485) and (0.525, 0.450).

An arrangement for generating mixed light is thus provided, which comprises three semiconductor chips emitting in the blue spectral range. Arranged in the light paths of the individual semiconductor chips are different conversion elements having luminescent materials or mixtures thereof which are configured to convert primary radiation into secondary radiation. The sum of the primary radiation and secondary radiation produces the respective total radiation exiting the respective device. The overall radiation exiting the arrangement of mixed light is referred to here and hereinafter as overall emission. The overall emission can be the sum of the first total radiation, the second total radiation and/or the third total radiation and is perceived by an observer as the emission from the arrangement.

In particular, one of the devices has a total radiation having a wavelength in the green spectral range of electromagnetic radiation, a further device has a total radiation having a wavelength in the reddish spectral range and a further device has a total radiation having a wavelength in the blueish-lilac spectral range. This blueish-lilac spectral range can be allocated a chromaticity coordinate which has the coordinates Cx in a range between 0.24 and 0.45 and Cy in a range between 0.1 and 0.28. Alternatively, one of the devices can have a total radiation having a wavelength in the green spectral range, a further device can have a total radiation having a wavelength in the red spectral range and another device can have a total radiation having a wavelength in the white spectral range.

Statements of color in relation to emitting conversion elements and/or total radiation refer here and hereinafter to the respective spectral range of electromagnetic radiation.

If a respective or corresponding or further device is mentioned herein, this can be the first, second and/or third device. The references to first, second and third device are not absolute but rather the numbering is used merely to differentiate between the individual devices. This applies analogously to the terms "conversion element", "semiconductor chip", "primary radiation", "secondary radiation", "total radiation", "luminescent material" and "chromaticity coordinate".

The total radiation exiting the respective device refers here and hereinafter to a mixture of primary radiation and secondary radiation ultimately leaving the device. The mixture ratio can be regulated and controlled by the composition and concentration of the corresponding luminescent material in the conversion element. In the case of full conversion, the total radiation can also simply be the secondary radiation. In the case of partial conversion, the total radiation refers to the sum of the primary radiation and secondary radiation.

In particular, this arrangement can be used to generate mixed light which is broadband in the visible spectral range. Broadband mixed light means that it can comprise a mixed-color wavelength range, i.e. a wavelength range having large wavelength differences ($\Delta\lambda \geq 50$ nm, in particular $\Delta\lambda \geq 100$ nm), wherein the mixed-color wavelength range can each comprise a continuous spectrum or several discrete spectral components having different wavelengths. This means in particular that the individual intensities of the individual total radiations to form the mixed light in a large wavelength range of e.g. at least 100 nm or 150 nm wide are constant. The term "constant" does not preclude that the intensity fluctuates about an average value by a certain deviation of e.g. 40% or 20% about the average value.

First, second and third chromaticity coordinate refers here to points in or on a color body whose position in the color space is described using suitable coordinates. The chromaticity coordinate represents the color perceived by an observer. The chromaticity coordinate is a coordinate or coordinates in the standard valency system adopted by the CIE (the International Commission on Illumination). The CIE color diagram shows all the perceivable colors, that is to say the visible portion of electromagnetic radiation. Each and every color is defined within this diagram by means of three coordinates $C_x$, $C_y$, $C_z$, wherein two coordinates are sufficient for determining the color since the sum of all three coordinates must always equal 1 and therefore $C_z$ can easily be calculated from $C_x$ and $C_y$. Such a color coordinate is referred to here as the chromaticity coordinate of the total radiation. For the chromaticity coordinates of the luminescent materials, the color coordinates $L_x$ and $L_y$ are used here, wherein these can be used analogously to $C_x$ and $C_y$. The colors of light sources and/or objects can be clearly determined via two values $C_x$ and $C_y$ using the CIE color diagram. The $C_x$ and $C_y$ values are to be determined using measuring technology. Alternatively or in addition, the chromaticity coordinates are calculated from a measured spectrum. The spectra can be recorded using a spectrometer.

Each point in the CIE color diagram represents the chromaticity coordinate of a chroma. Colors having an identical chroma differ only in the brightness thereof. This is also referred to as color saturation. The so-called achromatic point or white point (WP) is located in the central region of the CIE color diagram at $C_x=0.33$ and $C_y=0.33$. The edge curve of the CIE color diagram is composed of the spectrum locus of 380 nm (blue-violet) to 780 nm (dark red) and the so-called purple line. By way of an additive color mixture from e.g. two radiation sources, the chromaticity coordinate can lie on the straight connection. In the case of three radiation sources, each chromaticity coordinate within a fixed triangle can be achieved (gamut).

The term "black body curve" is used here to refer to a curve in the CIE color diagram. The course of the black body curve specifies the colors as temperatures of an ideal emitter in degrees Kelvin. The CIE color diagram and the black body curve are well-known to a person skilled in the art and therefore are not explained in more detail at this juncture.

A deviation of at the most 0.02 from the black body curve refers here and hereinafter to a deviation from the black body curve of 0.02 units in the CIE color diagram. The first chromaticity coordinate lies in a color quadrilateral having the coordinates (0.285, 0.345), (0.285, 0.500), (0.390, 0.500) and (0.390, 0.345). In particular, the first chromaticity coordinate of the first device lies within a color quadrilateral having the corner points (0.300, 0.425), (0.308, 0.430), (0.388, 0.407) and (0.370, 0.390) and/or (0.322, 0.482), (0.330, 0.500), (0.384, 0.450) and (0.375, 0.432) and/or (0.335, 0.345), (0.335, 0.365), (0.355, 0.365) and (0.355, 0.345).

The second chromaticity coordinate lies in a color quadrilateral having the corner points (0.300, 0.225), (0.375, 0.225), (0.300, 0.340) and (0.475, 0.340).

In particular, the second chromaticity coordinate lies within a color quadrilateral having the coordinates (0.325, 0.225), (0.350, 0.225), (0.350, 0.275) and (0.325, 0.275) and/or within a color quadrilateral having the coordinates (0.350, 0.325), (0.365, 0.325), (0.350, 0.340) and (0.365, 0.340) and/or within a color quadrilateral having the coordinates (0.445, 0.309), (0.457, 0.318), (0.425, 0.325) and (0.439, 0.337).

The third chromaticity coordinate lies in a color quadrilateral having the corner points (0.425, 0.400), (0.525, 0.400), (0.425, 0.485) and (0.525, 0.450). In particular, the third chromaticity coordinate lies within a color quadrilateral having the coordinates (0.475, 0.400), (0.425, 0.400), (0.425, 0.440) and (0.475, 0.440) and/or within a color quadrilateral having the coordinates (0.515, 0.420), (0.495, 0.420), (0.515, 0.450) and (0.495, 0.450) and/or within a color quadrilateral having the coordinates (0.425, 0.465), (0.425, 0.475), (0.440, 0.475) and (0.440, 0.465).

The mixing ratio of primary and secondary radiation of the corresponding device, the composition of the luminescent material to be used, and the spectral properties, such as peak maxima, dominant wavelength and full width at half maximum of the corresponding devices produce the chromaticity coordinate of the corresponding total radiation.

According to at least one embodiment, the arrangement for generating mixed light consists of a first, second and third device. In other words, no other device is provided in the arrangement for generating mixed light. One device partially converts primary radiation into secondary radiation and two devices fully convert primary radiation into secondary radiation. Alternatively, two devices can partially convert primary radiation into secondary radiation and one device can fully convert primary radiation into secondary radiation.

In other words, the arrangement for generating mixed light includes or exhibits partial conversion and also full conversion of electromagnetic primary radiation into electromagnetic secondary radiation.

Herein, the terms first, second and/or third device are not only intended to mean complete devices such as, for example, light-emitting diodes (LEDs) or laser diodes, but also functional units suitable for generating light such as substrates and/or semiconductor layers which are not a complete device. Further required elements can also share a plurality of devices in the arrangement. In particular, the first, second and/or third device can be a thin-film semiconductor chip, in particular a thin-film light-emitting diode chip.

According to at least one embodiment, the first, second and/or third semiconductor chip each comprise a semiconductor layer sequence. The semiconductor chip comprises in particular an active region which is configured to emit primary radiation. According to at least one embodiment, the first, second and/or third primary radiation is selected from a wavelength range of 420 nm to 490 nm, in particular at least 430 nm or 440 nm or 445 nm or 452 nm and/or at the most 480 nm or 470 nm or 465 nm, e.g. 460 nm. The stated wavelengths refer to the dominant wavelength or the wavelength of maximum intensity, also called peak wavelength.

According to this embodiment, the semiconductor materials provided in the semiconductor layer sequence are not restricted so long as they at least partially have electroluminescence. The semiconductor materials used can be, for example, compounds of elements selected from indium, gallium, aluminum, nitrogen, phosphorus, arsenic, oxygen, silicon, carbon and combinations thereof. However, other elements and additives can also be used. The layer sequence having an active region can be based, for example, on nitride compound semiconductor materials. In the present context, "based on a nitride compound semiconductor material" means that the semiconductor layer sequence or at least a part thereof comprises or consists of a nitride compound semiconductor material, preferably $Al_nGa_mIn_{1-n-m}N$, where $0 \leq n \leq 1$, $0 \leq m \leq 1$ and $n+m \leq 1$. This material does not absolutely have to exhibit a mathematically exact composition according to the above formula. Rather, it may comprise one or more dopants and additional constituents. For the sake of simplicity, however, the above formula includes only the essential constituents of the crystal lattice (Al, Ga, In, N), even if these may in part be replaced and/or supplemented by small quantities of further substances.

The semiconductor layer sequence can for example comprise, as the active region, a conventional pn-junction, a double heterostructure, a single quantum well structure (SQW structure) or a multiple quantum well structure (MQW structure). In addition to the active region, the semiconductor layer sequence can include further functional layers and functional regions, for instance p- or n-doped charge carrier transport layers, i.e. electron or hole transport layers, p- or n-doped confinement or cladding layers, buffer layers and/or electrodes and combinations thereof. Such structures relating to the active region or the further functional layers and regions are known to the person skilled in the art, in particular in relation to design, function and structure and therefore are not explained in more detail at this juncture.

The first, second and/or third conversion element includes luminescent materials or mixtures of luminescent materials.

According to at least one embodiment, the first conversion element includes or consists of a first luminescent material which is a doped aluminum gallium oxide.

In particular, a first luminescent material of a conversion element has the composition $Y_3(Al_{1-x}Ga_x)_5O_{12}:Ce^{3+}$ where $0<x<1$ and/or $Lu_3(Al_{1-x}Ga_x)_5O_{12}:Ce^{3+}$ where $0<x<1$. By varying the proportion x of gallium and/or the cerium concentration in the first luminescent material, the spectral property and thus the chromaticity coordinate of the corresponding device can be influenced. The first luminescent material $Y_3(Al_{1-x}Ga_x)_5O_{12}:Ce^{3+}$ can have a different chromaticity coordinate depending upon the proportion x of gallium and/or cerium. The scattering properties of the luminescent material, which in turn can be influenced by the particle size and particle size distribution width, can influence the chromaticity coordinate.

According to at least one embodiment, the first conversion element having a first luminescent material fully converts the first primary radiation. The first luminescent material is selected from the following group and combinations thereof and has a following chromaticity coordinate in the CIE color diagram 1931 having the coordinates ($L_{x1}$, $L_{y1}$). The $L_{x1}$ value corresponds in the CIE color diagram to the x-axis Cx and the $L_{y1}$ value corresponds in the CIE color diagram to the y-axis Cy. This also applies accordingly for ($L_{x2}$, $L_{y2}$) and ($L_{x3}$, $L_{y3}$):

$Y_3(Al_{1-x}Ga_x)_5O_{12}:Ce^{3+}$ where $0<x<1$ and $0.432 \leq L_{x1} \leq 0.469$ and $0.520 \leq L_{y1} \leq 0.545$, $Y_3(Al_{1-x}Ga_x)_5O_{12}:Ce^{3+}$ where $0<x<1$ and $0.453 \leq L_{x1} \leq 0.469$ and $0.532 \leq L_{y1} \leq 0.520$, $Lu_3(Al_{1-x}Ga_x)_5O_{12}:Ce^{3+}$ where $0<x<1$ and $0.356 \leq L_{x1} \leq 0.374$ and $0.561 \leq L_{y1} \leq 0.573$.

In other words, the chromaticity coordinates stated here of the first luminescent material also describe the possible chromaticity coordinates of the first device because or if the primary radiation of the first device is fully converted into secondary radiation.

According to at least one embodiment, the second conversion element includes or consists of a second luminescent material which is a doped silicon oxynitride, a doped silicon nitride, a doped aluminum gallium oxide, a doped aluminum silicon oxide and/or a doped chlorosilicate and combinations thereof. In particular, the second luminescent material is selected from the following group or combinations thereof: $Lu_3(Al_{1-x}Ga_x)_5O_{12}:Ce^{3+}$ where $0<x<1$, $(Ba_{1-x}Sr_x)Si_2O_2N_2:Eu^{2+}$ where $0<x<1$, $CaAlSiN_3:Eu^{2+}$, $Ca_8Mg(SiO_4)_4Cl_2:Eu^{2+}$, $(Ca_{1-x-y}Ba_xSr_y)_2Si_5N_8:Eu^{2+}$ where $0<x<1$ and $0<y<1$.

By varying the proportion x of gallium and/or barium and/or the proportion y of strontium and/or the cerium or europium concentration in the second luminescent material, the spectral property and thus the chromaticity coordinate of the corresponding device and/or the chromaticity coordinate of the second luminescent material can be influenced and set.

According to at least one embodiment, the second conversion element having a second luminescent material fully converts the second primary radiation. The second luminescent material is selected from the following group and combinations thereof and has a following chromaticity coordinate in the CIE color diagram 1931 having the coordinates ($L_{x2}$, $L_{y2}$):

$Lu_3(Al_{1-x}Ga_x)_5O_{12}:Ce^{3+}$ where $0<x<1$ and $0.356 \leq L_{x2} \leq 0.374$ and $0.561 \leq L_{y2} \leq 0.573$, $(Ba_{1-x}Sr_x)Si_2O_2N_2:Eu^{2+}$ where $0<x<1$ and $0.428 \leq L_{x2} \leq 0.431$ and $0.555 \leq L_{y2} \leq 0.553$, $CaAlSiN_3:Eu^{2+}$ where $0.663 \leq L_{x2} \leq 0.675$ and $0.323 \leq L_{y2} \leq 0.333$, $Ca_8Mg(SiO_4)_4Cl_2:Eu^{2+}$ where $0.2000 \leq L_{x2} \leq 0.210$ and $0.630 \leq L_{y2} \leq 0.640$, $(Ca_{1-x-y}Ba_xSr_y)_2Si_5N_8:Eu^{2+}$ where $0<x<1$ and $0<y<1$ and $0.608 \leq L_{x2} \leq 0.639$ and $0.360 \leq L_{y2} \leq 0.390$.

According to at least one embodiment, the third conversion element includes or consists of a third luminescent material which is a doped aluminum gallium oxide, a doped aluminum silicon nitride and/or a doped silicon nitride and combinations thereof. In particular, the third luminescent material is selected from the following group or combinations thereof: $Y_3(Al_{1-x}Ga_x)_5O_{12}:Ce^{3+}$ where $0<x<1$, $CaAlSiN_3:Eu^{2+}$, $(Ca_{1-x-y}Ba_xSr_y)_2Si_5N_8:Eu^{2+}$.

By varying the proportion x of gallium and/or barium and/or the proportion y of strontium and/or the cerium or europium concentration in the third luminescent material, the spectral property and thus the chromaticity coordinate of the corresponding device and/or the chromaticity coordinate of the third luminescent material can be influenced and set.

According to at least one embodiment, the third conversion element having a third luminescent material fully converts the third primary radiation. The third luminescent material is selected from the following group and combinations thereof and has a following chromaticity coordinate in the CIE color diagram 1931 having the coordinates ($L_{x3}$, $L_{y3}$):

$Y_3(Al_{1-x}Ga_x)_5O_{12}:Ce^{3+}$ where $0<x<1$ and $0.432 \leq L_{x3} \leq 0.469$ and $0.520 \leq L_{y3} \leq 0.545$, $CaAlSiN_3:Eu^{2+}$ where $0.608 \leq L_{x3} \leq 0.639$ and $0.360 \leq L_{y3} \leq 0.390$, $(Ca_{1-x-y}Ba_xSr_y)_2Si_5N_8:Eu^{2+}$ where $0<x<1$ and $0<y<1$ and $0.608 \leq L_{x3} \leq 0.639$ and $0.360 \leq L_{y3} \leq 0.390$.

According to at least one embodiment, the second and/or third luminescent material is or includes $Sr(Sr_aCa_{1-a})Si_2Al_2N_6:D$. D is at least one activation element. Frequently, D is formed by the element Eu and/or even Ce. Other or additional activation elements or dopants can be selected from the group Mn, Ce, Pr, Nd, Sm, Eu, Gd, Tb, Dy, Ho, Er, Tm, Yb and Lu, in each case individually or in combination. An activator content, i.e. a proportion of the lattice sites of Sr and Ca, which is replaced by D, is preferably at least 0.1% or 0.25% or 0.4% or 0.55% and/or at the most 2.2% or 1.5% or 1.0% or 0.85% or 0.7%, as is particularly the case when D=Eu. It is possible that the luminescent material comprises further elements, for instance in the form of impurities, wherein these impurities should together make up preferably at the most a weight proportion in the luminescent material of at the most 0.1 per mill or 100 ppm or 10 ppm (parts per million). Also, a total formula of the type $Sr_{1-e}(Sr_aCa_{1-a})_{1-g}(Si,C)_{2+d}(Al,B)_{2-d}(N,O,F,Cl,C)_6:Eu$ is one possible description of this luminescent material, where $a+b \leq 1$ and $c+d \leq 1$, wherein the parameters a, b, c, d, e, f and g preferably satisfy the following conditions: $0 \leq a \leq 0.1$ and $0 \leq c \leq 0.1$ and $0 \leq b \leq 1$ and $0 \leq d \leq 1$ and $a+c > 0$ and $b+d < 2$ and $0.1 \leq e \leq 8$ and $0.1 \leq f \leq 16$ and $0.8$ $(f+4/3\ e+2/3\ (b+d)) \leq g$ and $g \leq 1.2$ $(f+4/3\ e+2/3\ (b+d))$. Preferably this is $Sr(Sr_aCa_{1-a})Si_2Al_2N_6:Eu^{2+}$, where a is at least 0.6 or 0.64 or 0.68 or 0.8 or 0.84 or 0.92 and/or at the most 1.0 or 0.98 or 0.96 or 0.92.

According to at least one embodiment, the second and/or third luminescent material is or includes $Sr(Sr,Ca)Si_2Al_2N_6:Eu^{2+}$ and alternatively or in addition $(Sr,Ca)AlSiN_3:Eu^{2+}$. In contrast to $(Sr,Ca)AlSiN_3:Eu^{2+}$, in $Sr(Sr,Ca)Si_2Al_2N_6:Eu^{2+}$ a layer of pure Sr alternates with a layer of unordered Sr and Ca. As a result, differences in the emission wavelength and in the full width at half maximum of the emission are produced. In particular, this luminescent material exhibits in the X-ray structure analysis in the orthorhombic description a reflex having the Miller index 1$\bar{2}$1, for instance in a powder diffractogram with monochromatic irradiation having Cu—$K_{\alpha 1}$-radiation at 2θ between 36.7° and 37.0°.

According to at least one embodiment, the conversion element arranged in the beam path of the respective semiconductor chip fully or partially converts the respective primary radiation into secondary radiation. "Fully converting" the primary radiation into secondary radiation can be referred to as "full conversion" and "partially converting" the primary radiation into secondary radiation can be referred to as "partial conversion". "Full conversion" is understood here to mean that at least 90% of the primary radiation is converted into secondary radiation. In particular, more than 95%, e.g. more than 99% or 100% of the primary radiation is converted into secondary radiation. "Partial conversion" is understood to mean that less than or equal to 90% of the primary radiation is converted into secondary radiation. For example, only less than or equal to 50% of the primary radiation is converted into secondary radiation.

According to at least one embodiment, the first, second and third devices are configured such that the generation of the respective primary radiation in each of the three devices can be independently controlled. For instance, the devices can be actuated independently of each other. For example, the devices can be actuated at the same time or at different times. Actuation can also be effected with different current intensities of the respective devices. Sequential actuation of the respective devices is likewise feasible. As a result, different intensities of the respective primary radiation can be produced. This can contribute to different color saturation of the overall emission or the corresponding total radiation. Owing to the different current intensities at the individual semiconductor chips, all the chromaticity coordinates within the triangle plotted by the chromaticity coordinates can be achieved. In a photograph, the problem exists that the surrounding light often differs from the chromaticity coordinate of the flash light. The camera performs a white balance but this is extremely prone to errors for the overall picture detail of the photograph. By adapting the chromaticity coordinate of the flash light to the surrounding light, an improved color reproduction of the photograph can be achieved. According to at least one embodiment, an overall emission includes a first, second and third total radiation. The overall emission has an intensity which is constant in the wavelength range of 500 nm to 650 nm, in particular 520 nm to 600 nm with a deviation of +/−40%. In other words, the overall emission, that is to say the overall radiation exiting the arrangement has a broad or broadband emission spectrum.

According to at least one embodiment, each conversion element converts a primary radiation emitted by another semiconductor chip. In other words, the respective conversion elements do not have a common primary radiation. As a result, reabsorption and undesired emission spectra are avoided.

According to at least one embodiment, the first, second and/or third chromaticity coordinate has a color saturation of less than or equal to 82%, in particular less than or equal to 50%. Color saturation describes in this case the quality of the color effect. The color saturation of a point of the CIE color diagram is determined by drawing a straight line from the neutral point or white point WP to the color point (F1, F2, F3). The ratio of the distance white point-chromaticity coordinate (WP-F) to the distance white point-outer edge P or spectrum locus (WP-P) of the CIE color diagram is the measurement for the saturation. Each chromaticity coordinate on the spectrum locus thus has the saturation 1 (corresponding to 100%). In other words, the chromaticity coordinates described here are rather unsaturated.

According to at least one embodiment, the color saturation of the first chromaticity coordinate is less than or equal to 50%. Particularly, the color saturation of the first chromaticity coordinate is between 10 and 45%, e.g. 30%.

According to at least one embodiment, the color saturation of the second chromaticity coordinate is less than or equal to 70%, particularly the color saturation of the second chromaticity coordinate is between 10 and 54%, e.g. 34%.

According to at least one embodiment, the color saturation of the third chromaticity coordinate is less than or equal to 82%. Particularly, the color saturation of the third chromaticity coordinate is between 30 and 82%, e.g. 71%.

According to at least one embodiment, the arrangement for generating mixed light is used for flash light applications in cameras and/or mobile telephone cameras. In particular, the mixed light or the overall emission is white light. Alternatively, the mixed light or the overall emission can be colored light. Light is visible light having wavelengths or wavelength ranges from a visible spectral range between about 350 nm and about 800 nm.

An arrangement for generating mixed light for flash light arrangements in mobile telephones advantageously has an emitted spectrum in which as many ranges as possible of visible light having a similar intensity are provided. Optionally, the spectrum of the arrangement for generating mixed light can also be adapted to detectors and specific software of mobile telephone cameras.

The inventors have recognized that owing to the arrangement of the different converter elements in different primary beam paths of different semiconductor chips, a broad emission spectrum can be produced, in that many wavelength ranges of visible light having a similar intensity are provided. Therefore, such arrangements for generating mixed light are suitable for flash light applications.

Alternatively or in addition, the arrangement for generating mixed light can also be used in continuous operation, and so not only flash light applications which produce a temporary flaring of the overall emission are included.

According to at least one embodiment, the first, second and third device are arranged in a housing, wherein a common lens is arranged in the beam path of the first, second and third total radiation. The common lens is configured to mix the first, second and third total radiation. As a result, an overall emission which has a broad wavelength range, in particular between 500 nm and 650 nm having a similar intensity, can exit the arrangement for generating mixed light.

According to at least one embodiment, the first, second and third devices are spaced apart from each other. This can be effected e.g. by walls or separators which spatially separate the devices from each other.

According to at least one embodiment, the first, second and third conversion elements are spaced apart from each other. In other words, the first, second and third conversion elements do not contact each other. As a result, intermixing of the respective primary radiation and/or secondary radiation can be prevented. Intermixing can occur downstream, e.g. in a lens arranged downstream in the beam path and therefore still within the arrangement. In particular, intermixing is homogeneous in the arrangement.

Furthermore, a method for operating an arrangement of mixed light is provided. The same definitions and embodiments as stated above for the arrangement for generating mixed light are applicable.

According to at least one embodiment, the first, second and third devices are actuated differently and/or sequentially. In other words, the devices can be operated with different current intensities and/or voltages. Alternatively, the current intensities and/or voltages of the respective devices can be identical, but are operated at different times. As a result, a continuous color range of the arrangement for generating mixed light can be achieved. If the elements are supplied with identical current, a corresponding chromaticity coordinate on the black body curve can be achieved. Alternatively or in addition, the first and/or second device can receive less current than the third device. In particular, the first and second device is operated with a lower current intensity than the third device.

The term "supplied with current" means here and hereinafter applying a current intensity and/or voltage to a device.

According to at least one embodiment, the arrangement for generating mixed light is operated such that the first, second and third component are simultaneously actuated with a constant current intensity. "Constant current intensity" means here a constant value of the current intensity. Alternatively, the current intensity can also be constant over time.

Further advantages and advantageous embodiments and developments of the subject matter in accordance with the invention will be explained in more detail hereinafter with the aid of the figures and exemplified embodiments.

Figure 8A:
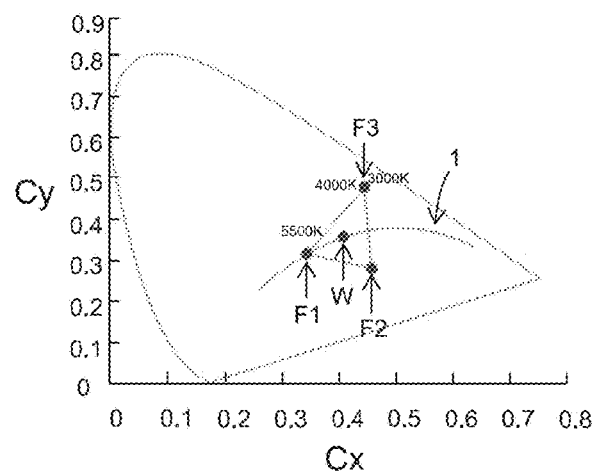
Figure 8B:
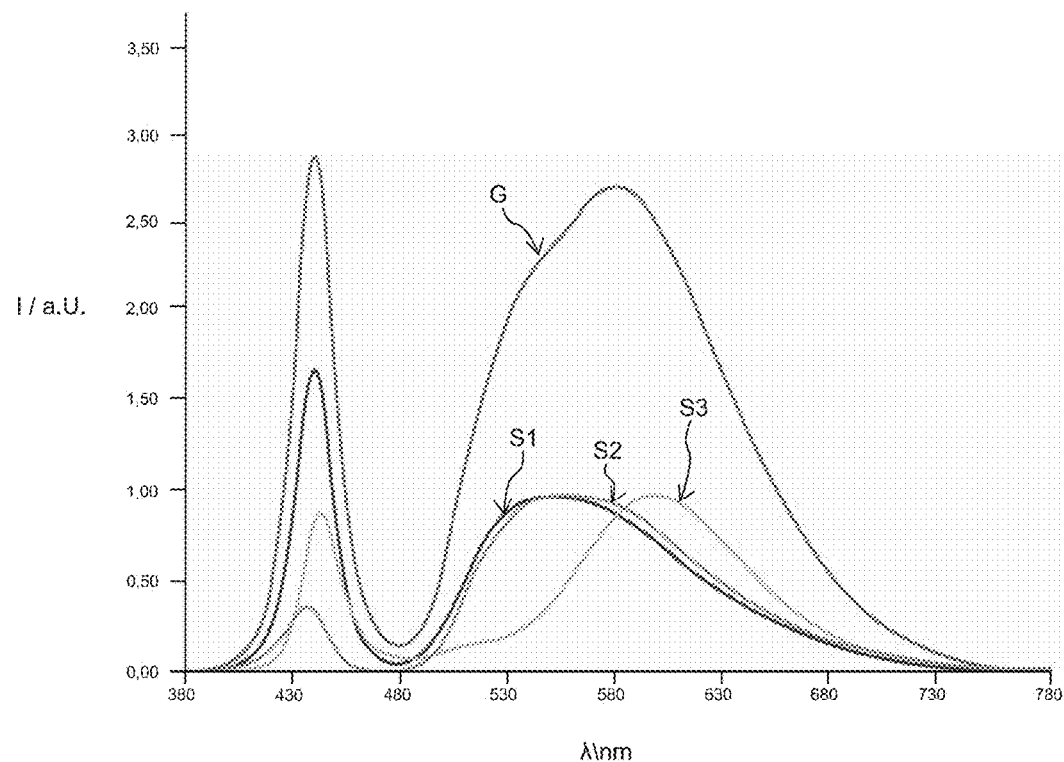
Figure 9A:
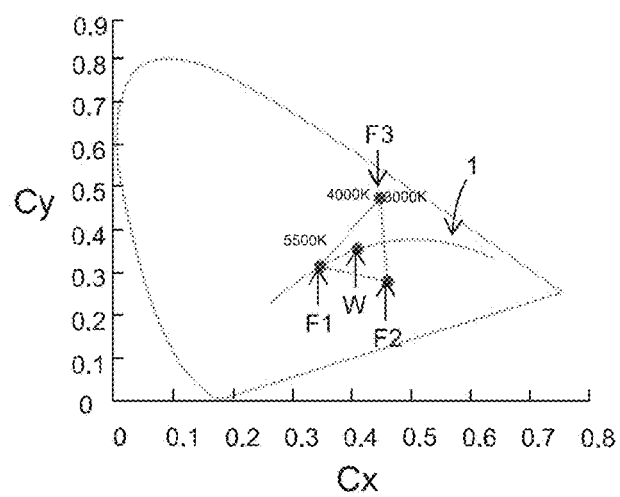
Figure 9B:
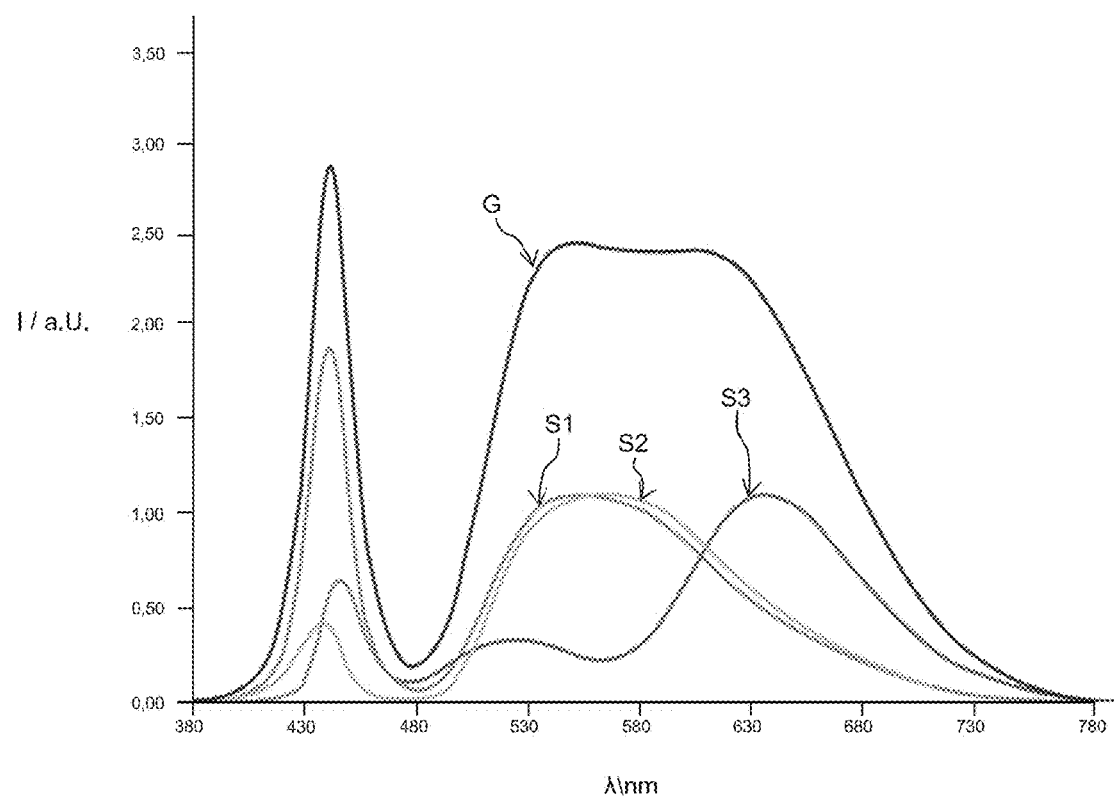
Figure 10:
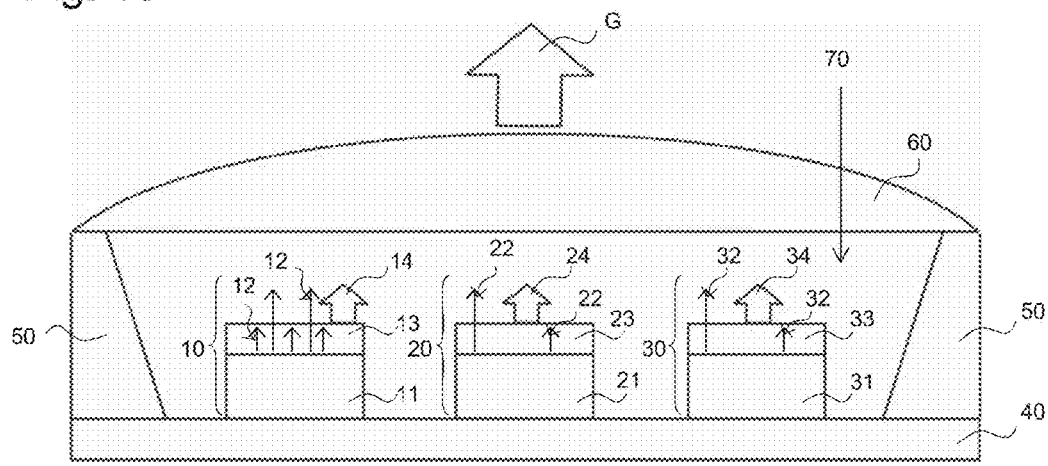
Figure 11:
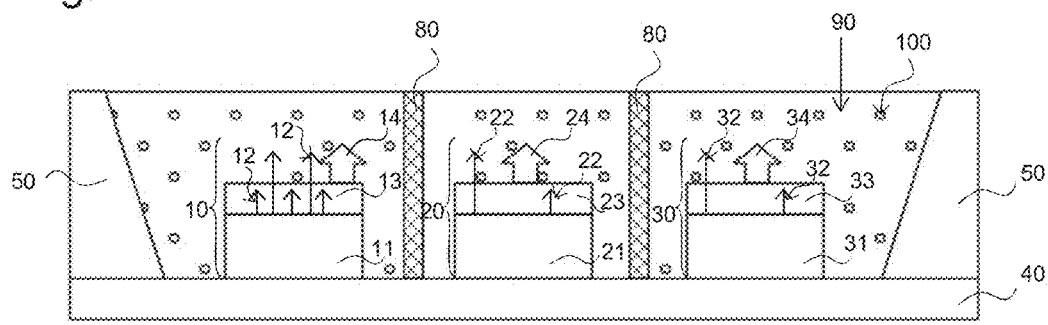
Figure 12:
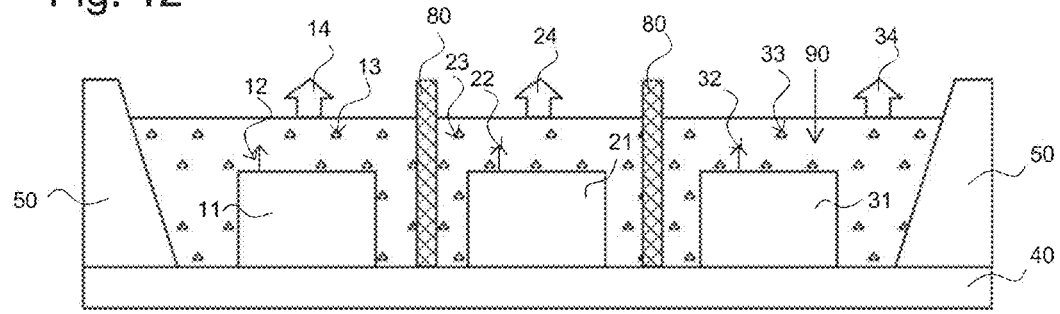
Figure 13:
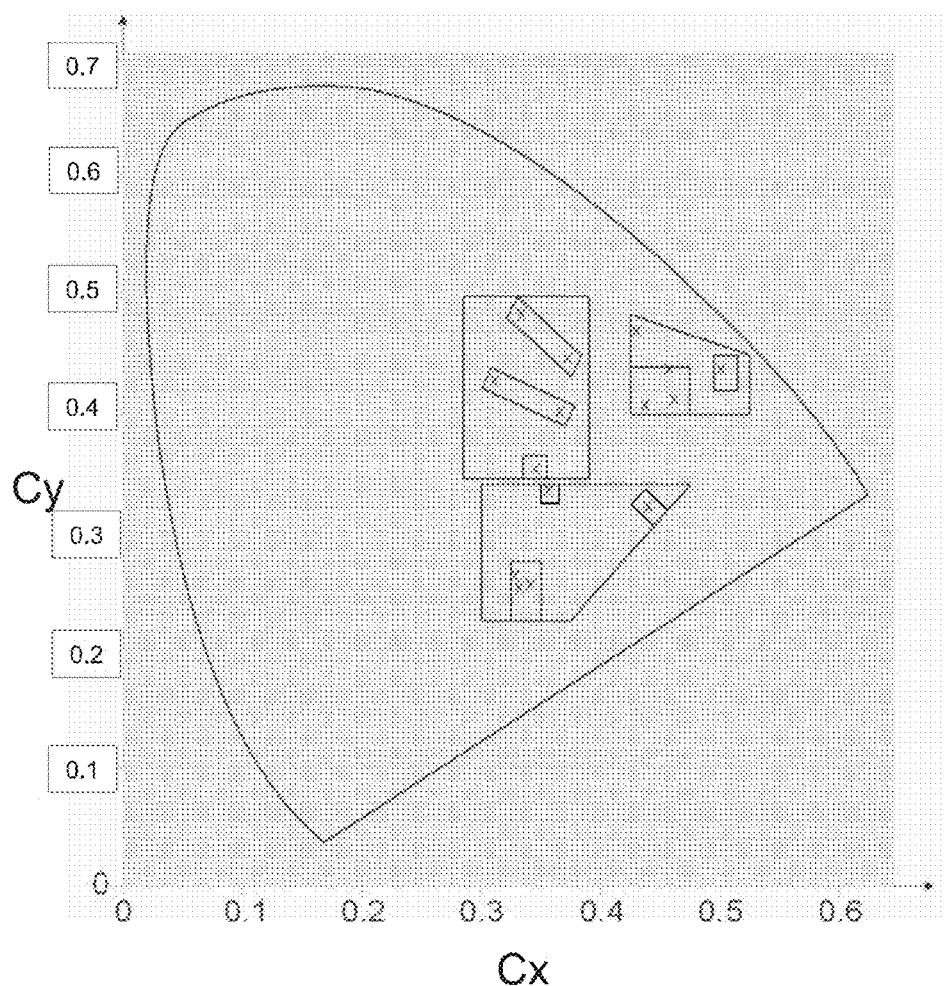

FIG. 1 shows chromaticity coordinates in the CIE color diagram,

FIGS. 2A, 3A, 4A, 5A, 6A, 7A, 8A and 9A each show possible chromaticity coordinates in the CIE color diagram according to one embodiment, FIGS. 2B, 3B, 4B, 5B, 6B, 7B, 8B and 9B each show emission spectra according to one embodiment, FIGS. 10 to 12 each show a schematic side view of an arrangement for generating mixed light according to one embodiment, and FIG. 13 shows possible chromaticity coordinates in the CIE color diagram according to one embodiment.

In the exemplified embodiments and figures, like components or components acting in an identical manner are each provided with like reference numerals. In principle, the illustrated elements or their size ratios with respect to each other are not to be considered as being to scale.

Exemplified embodiments for the arrangement for generating mixed light are described hereinafter. By specifying the respective chromaticity coordinate of the corresponding device, the composition of the corresponding conversion element, the emission spectrum, in particular the peak maxima and dominant wavelengths and the full width at half maximum of the respective device are produced.

The chromaticity coordinate can also be referred to here and hereinafter as color range.

"Peak maxima" means here and hereinafter a wavelength at which the intensity has a maximum value.

"Dominant wavelength" means here and hereinafter a color tone-identical wavelength which is perceived by the human eye when being observed. Dominant wavelength is also referred to as perceived wavelength. It is dependent upon the absolute wavelength and the bandwidth.

The full width at half maximum of a function having a maximum is the difference between the two wavelength values for which the intensity values have fallen to half the maximum.

The respective chromaticity coordinate W in FIGS. 2A, 3A, 4A, 5A, 6A, 7A, 8A and 9A shows the possible chromaticity coordinate of the entire arrangement or of the mixed light when the first, second and third devices have the first chromaticity coordinate F1, the second chromaticity coordinate F2 and the third chromaticity coordinate F3. Other chromaticity coordinates for the entire arrangement can be produced within the plotted triangle having the corner points F1, F2 and F3.

FIG. 1 shows in general a CIE color diagram having the x-axis $C_x$ and the y-axis $C_y$. Three chromaticity coordinates A, B and C are shown in the CIE color diagram. The three chromaticity coordinates A, B and C span a triangle. All the chromaticity coordinates can be produced within this triangle.

For the exemplified embodiments discussed hereinafter, a primary radiation emitted by the respective semiconductor chip of the respective device can be selected from the blue spectral range. The wavelength or wavelength range of the individual primary radiations of the respective devices can be the same or different. In particular, each device has a different wavelength for the primary radiation.

Figure 2A:
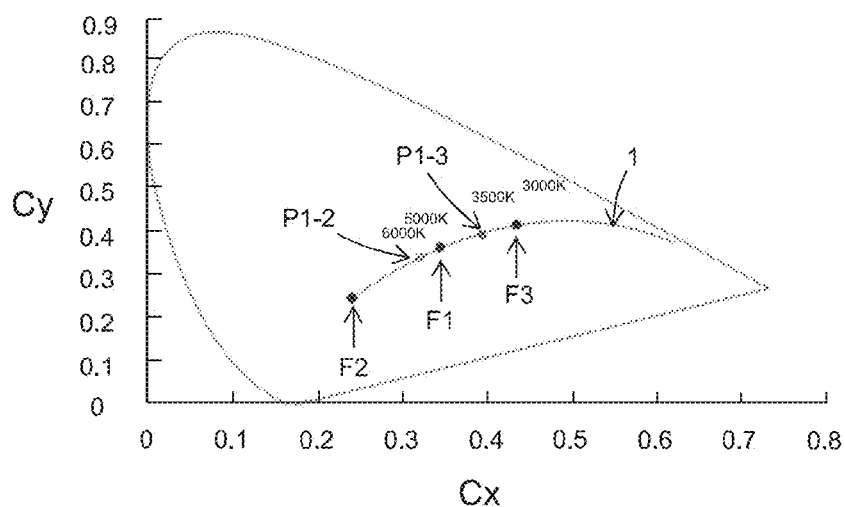

FIG. 2A shows a CIE color diagram having the x-axis $C_x$ and the y-axis $C_y$ according to one embodiment. The chromaticity coordinates F1 to F3 of the respective devices 10, 20 and 30 can be produced by the following arrangement: The first device 10 has a white color tone. In other words, the first device emits a total radiation having a first chromaticity coordinate, wherein the first chromaticity coordinate lies in the "white region" of the CIE color diagram. Color details in relation to the chromaticity coordinate refer here and hereinafter to the corresponding Cx and Cy coordinates which produce wavelengths in the corresponding spectral range, in this case white, of the total radiation. This applies accordingly to the following statements. The color range is preferably located on the black body curve 1 with a color temperature selected from a range of 6,500 K to 4,500 K with a deviation of 3 steps of a MacAdam ellipse. In other words, the chromaticity coordinate of the first device has a value which is located in the region of the black body curve 1 with a color temperature selected from a range of 6,500 K to 4,500 K with a deviation of 3 steps of a MacAdam ellipse. This applies accordingly to the following statements. For this purpose, it is preferred to use a first conversion element having a first luminescent material, $Y_3(Al_{1-x}Ga_x)_5O_{12}:Ce^{3+}$ where 0<x<1, or a mixture of a plurality of first luminescent materials. The value of the dominant wavelength of the first luminescent material is preferably located in the range of 568-575 nm at an excitation wavelength of 460 nm. The chromaticity coordinate of the first luminescent material preferably has the coordinates $L_{x1}$ and $L_{y1}$ at an excitation wavelength of 460 nm from the following range: $0.432 \leq L_{x1} \leq 0.469$ and $0.520 \leq L_{y1} \leq 0.545$.

Optionally, the chromaticity coordinate can be adapted by admixing a proportion of less than or equal to 10% of a red- or green-emitting luminescent material.

The second device 20 has a greenish-blue chromaticity coordinate. The color range is preferably located on the black body curve 1 with a color temperature selected from a range of 20,000 K to 10,000 K with a deviation of 3 steps of a MacAdam ellipse. For this purpose, it is preferred to use a second luminescent material, $Lu_3(Al_{1-x}Ga_x)_5O_{12}:Ce^{3+}$ where 0<x<1, or a mixture of a plurality of second luminescent materials. The value of the dominant wavelength of the second luminescent material is preferably located in the range of 558-562 nm at an excitation wavelength of 460 nm. The chromaticity coordinate of the second luminescent material preferably has the coordinates $L_{x2}$ and $L_{y2}$ at an excitation wavelength of 460 nm from the following range: $0.356 \leq L_{x2} \leq 0.374$ and $0.561 \leq L_{y2} \leq 0.573$.

Likewise, a $(Ba_{1-x}Sr_x)Si_2O_2N_2:Eu^{2+}$ where $0<x<1$ can be used, or a mixture of a $Lu_3(Al_{1-x}Ga_x)_5O_{12}:Ce^{3+}$ and a $(Ba_{1-x}Sr_x)Si_2O_2N_2:Eu^{2+}$. The value of the dominant wavelength of the $(Ba_{1-x}Sr_x)Si_2O_2N_2:Eu^{2+}$ is preferably located in the range of 564-568 nm at an excitation wavelength of 460 nm. The chromaticity coordinate of the second luminescent material preferably has the coordinates $L_{x2}$ and $L_{y2}$ at an excitation wavelength of 460 nm from the following range: $0.428 \leq L_{x2} \leq 0.431$ and $0.553 \leq L_{y2} \leq 0.555$.

Optionally, the chromaticity coordinate can be adapted by admixing a proportion of less than or equal to 10% of a red- or green-emitting luminescent material.

The third device 30 has a reddish chromaticity coordinate. The color range is preferably located on the black body curve 1 with a color temperature selected from a range of 3,500 K to 2,500 K with a deviation of 3 steps of a MacAdam ellipse. For this purpose, a mixture of two third luminescent materials is preferably used. A $Y_3(Al_{1-x}Ga_x)_5O_{12}:Ce^{3+}$ where $0<x<1$ mixed with a $CaAlSiN_3:Eu^{2+}$ or $(Ca_{1-x-y}Ba_xSr_y)_2Si_5N_8:Eu^{2+}$ where $0<x<1$ and $0<y<1$ and/or with an $Sr(Sr,Ca)Si_2Al_2N_6:Eu^{2+}$.

The dominant wavelength of the $Sr(Sr,Ca)Si_2Al_2N_6:Eu^{2+}$ luminescent material is preferably located in the range of 596 nm to 604 nm, at an excitation wavelength of 460 nm. The wavelength of maximum intensity of this luminescent material is located in the range of 608 nm to 625 nm. The full width at half maximum of the emission of this luminescent material is less than or equal to 80 nm. The chromaticity coordinate of the radiation emitted by the $Sr(Sr,Ca)Si_2Al_2N_6:Eu^{2+}$ luminescent material is preferably in the range of $0.600 \leq L_{x3} \leq 0.630$ and $0.370 \leq L_{y3} \leq 0.400$, at an excitation wavelength of 460 nm.

The value of the dominant wavelength of the $Y_3(Al_{1-x}Ga_x)_5O_{12}:Ce^{3+}$ is preferably located in the range of 568-575 nm, particularly preferably in the range of 572-575 nm, at an excitation wavelength of 460 nm. The chromaticity coordinate of the $Y_3(Al_{1-x}Ga_x)_5O_{12}:Ce^{3+}$ preferably has the coordinates $L_{x3}$ and $L_{y3}$ at an excitation wavelength of 460 nm from the following range: $0.432 \leq L_{x3} \leq 0.469$ and $0.520 \leq L_{y3} \leq 0.545$.

The value of the dominant wavelength of the $CaAlSiN_3:Eu^{2+}$ or $(Ca_{1-x-y}Ba_xSr_y)_2Si_5N_8:Eu^{2+}$ is preferably located in the range of 596-604 nm at an excitation wavelength of 460 nm. The chromaticity coordinate of the $CaAlSiN_3:Eu^{2+}$ or $(Ca_{1-x-y}Ba_xSr_y)_2Si_5N_8:Eu^{2+}$ preferably has the coordinates $L_{x3}$ and $L_{y3}$ at an excitation wavelength of 460 nm from the following range: $0.608 \leq L_{x3} \leq 0.639$ and $0.360 \leq L_{y3} \leq 0.390$.

By supplying the individual devices with current at different intensities, a color range of the arrangement having a color temperature of 20,000 K-2,500 K on the black body curve 1 can be achieved. This color range can be set steplessly. "Supplying current at different intensities" means here and hereinafter the independent regulation of the electrical current applied to the respective device.

The color saturation of the first chromaticity coordinate F1 is less than or equal to 15%, that of the second chromaticity coordinate F2 is less than or equal to 40% and that of the third chromaticity coordinate F3 is less than or equal to 55%, each with a deviation of +/−5%.

The chromaticity coordinates P1-2 and P1-3 in FIG. 2A lie on the black body curve 1. The chromaticity coordinate P1-2 results from exclusively supplying the first and second device with current, wherein the third device 30 is not supplied with current. The chromaticity coordinate P1-2 is thus produced from the first and second chromaticity coordinate. The chromaticity coordinate P1-3 results from exclusively supplying the first and third device with current, wherein the second device 20 is not supplied with current.

Figure 2B:
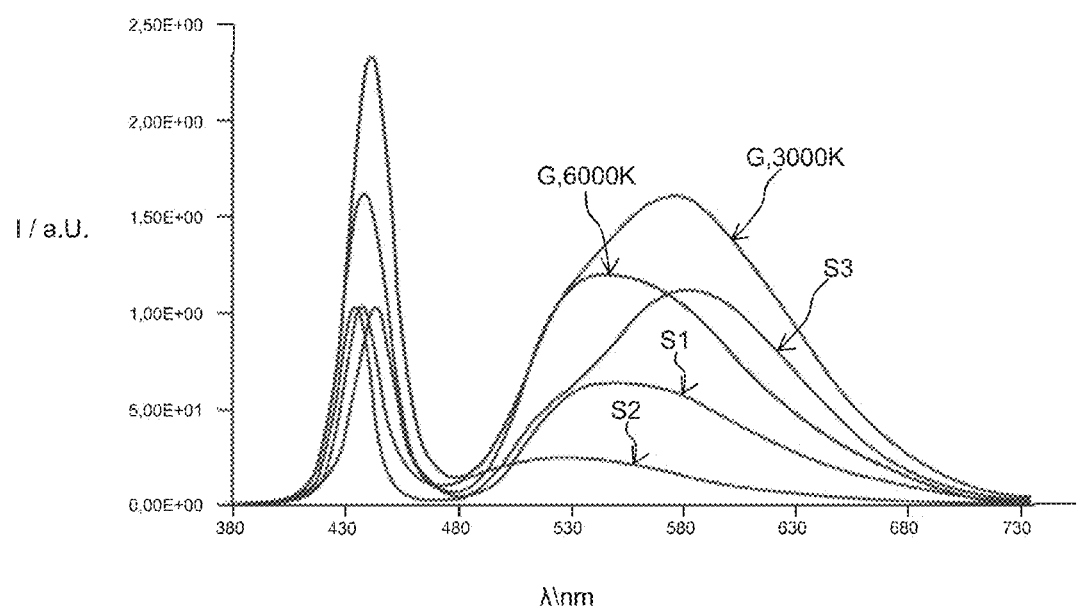

FIG. 2B shows the emission spectra associated with FIG. 2A. The first device 10 has a first total radiation S1 having two peak maxima at about 460 nm and about 560 nm, the second device 20 has a second total radiation S2 having two peak maxima at about 440 nm and about 530 nm and the third device 30 has a third total radiation S3 having two peak maxima at about 440 nm and about 600 nm. The sum of the first, second and third total radiation produces the overall emission G of the arrangement. G,6000K shows the overall emission at a color temperature of 6,000 K. G,3000K shows the overall emission at a color temperature of 3,000 K. The overall emission G,3000K or G,6000K each have at least two peak maxima at about 460 nm and about 580 nm for G,3000K and at about 460 nm and about 540 nm for G,6000K.

Figure 3A:
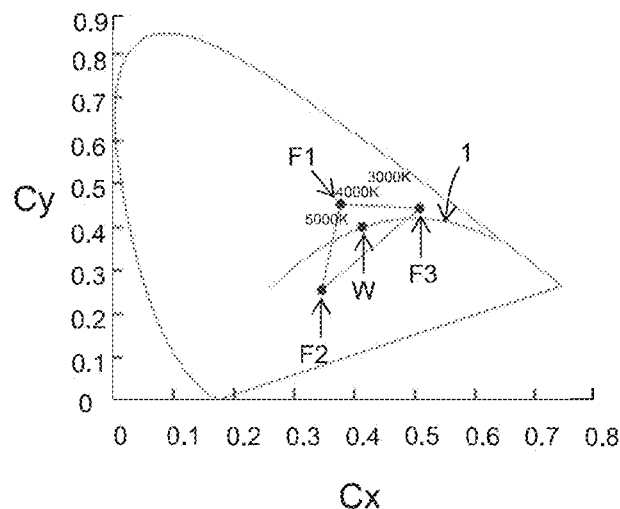

FIG. 3A shows a CIE color diagram having the x-axis $C_x$ and the y-axis $C_y$ according to one embodiment. The chromaticity coordinates F1 to F3 of the respective devices 10, 20 and 30 can be produced by the following arrangement: The first device 10 has a greenish-yellow color tone. The color range is preferably located in the range of Cx=0.373 and Cy=0.446 with a deviation of 2 steps of a MacAdam ellipse. For this purpose, a first luminescent material $Y_3(Al_{1-x}Ga_x)_5O_{12}:Ce^{3+}$ where $0<x<1$ is preferably used, or a mixture of a plurality of first luminescent materials comprising the composition $Y_3(Al_{1-x}Ga_x)_5O_{12}:Ce^{3+}$ where $0<x<1$. The value of the dominant wavelength of the $Y_3(Al_{1-x}Ga_x)_5O_{12}:Ce^{3+}$ is preferably located in the range of 572-575 nm, at an excitation wavelength of 460 nm. The proportion x of gallium can be selected between 0 and 1 such that the chromaticity coordinate of the first luminescent material $Y_3(Al_{1-x}Ga_x)_5O_{12}:Ce^{3+}$ preferably has the coordinates $L_{x1}$ and $L_{y1}$ from the following range: $0.453 \leq L_{x1} \leq 0.469$ and $0.520 \leq L_{y1} \leq 0.532$.

Optionally, the chromaticity coordinate can be adapted by admixing (<10% proportion) of a red- or green-emitting luminescent material.

The second device 20 has a blue-lilac chromaticity coordinate. The color range is preferably located in the range of Cx=0.341 and Cy=0.254 with a deviation of 2 steps of a MacAdam ellipse. For this purpose, a mixture of second luminescent materials, in particular a mixture of $CaAlSiN_3:Eu^{2+}$ and $Ca_8Mg(SiO_4)_4Cl_2:Eu^{2+}$, is preferably used.

The value of the dominant wavelength of the $CaAlSiN_3:Eu^{2+}$ is preferably located in the range of 641-645 nm at an excitation wavelength of 460 nm. At an excitation wavelength of 460 nm, the chromaticity coordinate of the $CaAlSiN_3:Eu^{2+}$ has the coordinates $L_{x2}$ and $L_{y2}$ from the following range: $0.663 \leq L_{x2} \leq 0.675$; $0.323 \leq L_{y2} \leq 0.333$.

The value of the dominant wavelength of the $Ca_8Mg(SiO_4)_4Cl_2:Eu^{2+}$ is preferably located in the range of 523-529 nm at an excitation wavelength of 460 nm. At an excitation wavelength of 460 nm, the chromaticity coordinate of the $Ca_8Mg(SiO_4)_4Cl_2:Eu^{2+}$ has the coordinates $L_{x2}$ and $L_{y2}$ from the following range: $0.200 \leq L_{x2} \leq 0.210$; $0.630 \leq L_{y2} \leq 0.640$.

The third device 30 has a reddish chromaticity coordinate. The color range is preferably located in the range of Cx=0.501 and Cy=0.437 with a deviation of 2 steps of a MacAdam ellipse. For this purpose, a mixture of third luminescent materials, in particular a mixture of two third luminescent materials is preferably used. A $Y_3(Al_{1-x}Ga_x)_5O_{12}:Ce^{3+}$ where $0<x<1$ mixed with a $(Ca_{1-x-y}Ba_xSr_y)_2Si_5N_8:Eu^{2+}$ where $0<x<1$ and $0<y<1$ and/or with an Sr(Sr, Ca)Si$_2$Al$_2$N$_6$:Eu$^{2+}$. The value of the dominant wavelength of the Y$_3$ (Al$_{1-x}$Ga$_x$)$_5$O$_{12}$:Ce$^{3+}$ is preferably located in the range of 568-575 nm, particularly preferably in the range of 572-575 nm, at an excitation wavelength of 460 nm. At an excitation wavelength of 460 nm, the chromaticity coordinate of the Y$_3$ (Al$_{1-x}$Ga$_x$)$_5$O$_{12}$:Ce$^{3+}$ preferably has the coordinates L$_{x3}$ and L$_{y3}$ from the following range: 0.432 L$_{x3}$ 0.469 and 0.520≤L$_{y3}$≤0.545.

The value of the dominant wavelength of the (Ca$_{1-x-y}$Ba$_x$Sr$_y$)$_2$Si$_5$N$_8$:Eu$^{2+}$ is preferably located in the range of 596-604 nm at an excitation wavelength of 460 nm. At an excitation wavelength of 460 nm, the chromaticity coordinate of the (Ca$_{1-x-y}$Ba$_x$Sr$_y$)$_2$Si$_5$N$_8$:Eu$^{2+}$ preferably has the coordinates L$_{x3}$ and L$_{y3}$ from the following range: 0.608≤L$_{x3}$≤0.639; 0.360≤L$_{y3}$≤0.390.

The dominant wavelength of the Sr(Sr,Ca)Si$_2$Al$_2$N$_6$:Eu$^{2+}$ luminescent material is preferably located in the range of 596 nm to 604 nm, at an excitation wavelength of 460 nm. The wavelength of maximum intensity of this luminescent material is located in the range of 608 nm to 625 nm. The full width at half maximum of the emission of this luminescent material is less than or equal to 80 nm. The chromaticity coordinate of the radiation emitted by the Sr(Sr,Ca)Si$_2$Al$_2$N$_6$:Eu$^{2+}$ luminescent material is preferably in the range of 0.600≤L$_{x3}$≤0.630 and 0.370≤L$_{y3}$≤0.400, at an excitation wavelength of 460 nm.

The color saturation of the first chromaticity coordinate F1 is less than or equal to 48%, that of the second chromaticity coordinate F2 is less than or equal to 32% and that of the third chromaticity coordinate F3 is less than or equal to 78%, each with a deviation of +/−5%.

Figure 3B:
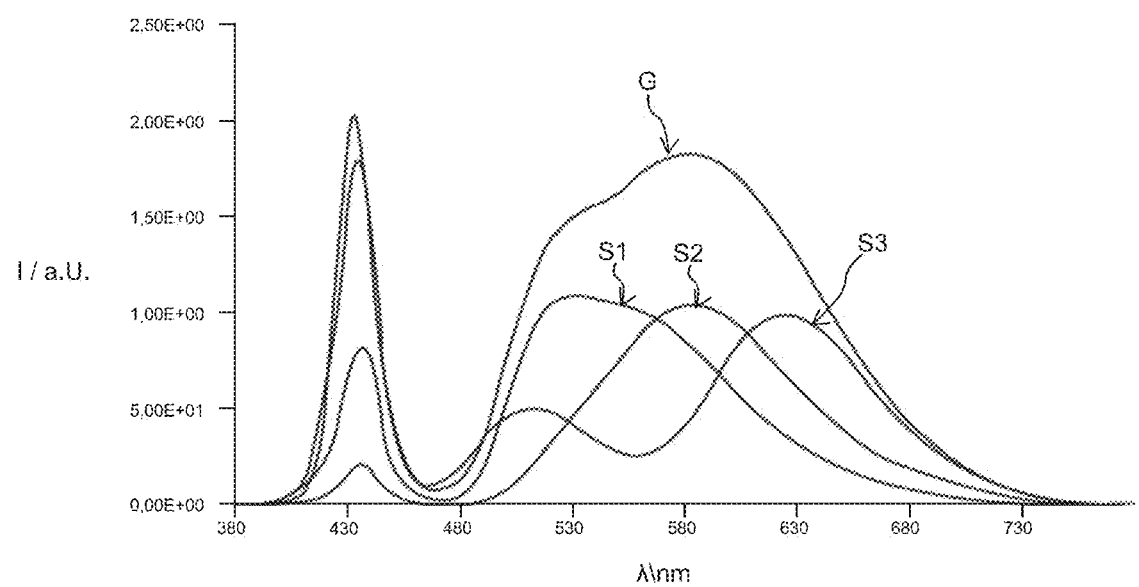

FIG. 3B shows the emission spectra associated with FIG. 3A. The first device 10 has a first total radiation S1 having two peak maxima at about 460 nm and about 530 nm, the second device 20 has a second total radiation S2 having three peak maxima at about 460 nm, 500 nm and about 630 nm and the third device 30 has a third total radiation S3 having two peak maxima at about 460 nm and about 580 nm. The sum of the first, second and third total radiation produces the overall emission G of the arrangement. The overall emission has at least two peak maxima at about 460 nm and about 580 nm. The overall emission in the wavelength range of 500 nm to 630 nm has an approximately constant intensity of about 1.5 a.u. with a deviation of about 40% from this value.

By supplying current differently, all the color points within the triangle of the chromaticity coordinates of the individual devices can be actuated. By supplying all the devices with current identically, a chromaticity coordinate having a color temperature of about 3,500 K on the black body curve 1 is achieved. By exclusively operating the first and second device, a chromaticity coordinate having a color temperature of 4,500 K on the black body curve 1 can be achieved.

Figure 4A:
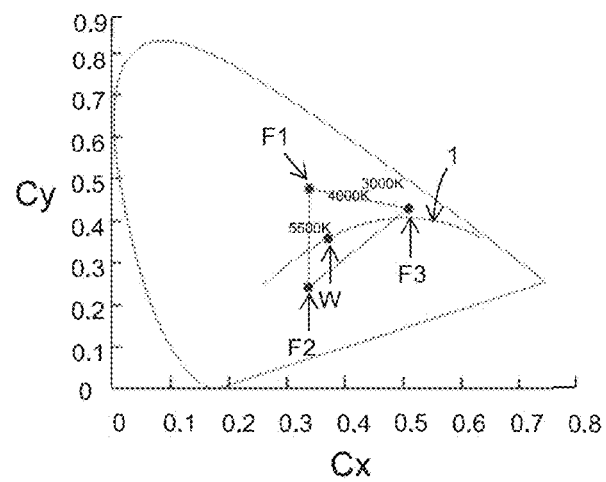

FIG. 4A shows a CIE color diagram having the x-axis C$_x$ and the y-axis C$_y$ according to one embodiment. The chromaticity coordinates F1 to F3 of the respective devices 10, 20 and 30 can be produced by the following arrangement: The first device 10 has a greenish color tone. The color range is preferably located in the range of Cx=0.334 and Cy=0.484 with a deviation of 2 steps of a MacAdam ellipse. For this purpose, a first luminescent material or a combination of first luminescent materials, e.g. Lu$_3$ (Al$_{1-x}$Ga$_x$)$_5$O$_{12}$:Ce$^{3+}$ where 0<x<1 is preferably used. The value of the dominant wavelength of the first luminescent material is preferably located in the range of 558-562 nm at an excitation wavelength of 460 nm. At an excitation wavelength of 460 nm, the chromaticity coordinate of the first luminescent material preferably has the coordinates L$_{x1}$ and L$_{y1}$ from the following range: 0.356≤L$_{x1}$≤0.374 and 0.561≤L$_{y1}$≤0.573.

The second device 20 has a blue-lilac chromaticity coordinate. The color range is preferably located in the range of Cx=0.332 and Cy=0.251 with a deviation of 2 steps of a MacAdam ellipse. For this purpose, a mixture of second luminescent materials, a CaAlSiN$_3$:Eu$^{2+}$ with a Ca$_8$Mg(SiO$_4$)$_4$Cl$_2$:Eu$^{2+}$, is preferably used. The value of the dominant wavelength of the CaAlSiN$_3$:Eu$^{2+}$ is preferably located in the range of 641-645 nm at an excitation wavelength of 460 nm. At an excitation wavelength of 460 nm, the chromaticity coordinate of the CaAlSiN$_3$:Eu$^{2+}$ preferably has the coordinates L$_{x2}$ and L$_{y2}$ from the following range: 0.663≤L$_{x2}$≤0.675 and 0.323≤L$_{y2}$≤0.333.

The value of the dominant wavelength of the Ca$_8$Mg(SiO$_4$)$_4$Cl$_2$:Eu$^{2+}$ is preferably located in the range of 523-529 nm at an excitation wavelength of 460 nm. The chromaticity coordinate of the Ca$_8$Mg(SiO$_4$)$_4$Cl$_2$:Eu$^{2+}$ preferably has the coordinates L$_{x2}$ and L$_{y2}$ at an excitation wavelength of 460 nm from the following range: 0.200≤L$_{x2}$≤0.210 and 0.630≤L$_{y2}$≤0.640.

The third device 30 has a reddish chromaticity coordinate. The color range is preferably located in the range of Cx=0.501 and Cy=0.437 with a deviation of 2 steps of a MacAdam ellipse. For this purpose, a mixture of two third luminescent materials is preferably used. A Y$_3$(Al$_{1-x}$Ga$_x$)$_5$O$_{12}$:Ce$^{3+}$ where 0<x<1 mixed with a (Ca$_{1-x-y}$Ba$_x$Sr$_y$)$_2$Si$_5$N$_8$:Eu$^{2+}$ where 0<x<1 and 0<y<1 and/or mixed with an Sr(Sr,Ca)Si$_2$Al$_2$N$_6$:Eu$^{2+}$. The value of the dominant wavelength of the Y$_3$ (Al$_{1-x}$Ga$_x$)$_5$O$_{12}$:Ce$^{3+}$ is preferably located in the range of 568-575 nm, particularly preferably in the range of 572-575 nm, at an excitation wavelength of 460 nm. The chromaticity coordinate of the Y$_3$ (Al$_{1-x}$Ga$_x$)$_5$O$_{12}$:Ce$^{3+}$ preferably has the coordinates L$_{x3}$ and L$_{y3}$ at an excitation wavelength of 460 nm from the following range: 0.432≤L$_{x3}$≤0.469 and 0.520≤L$_{y3}$≤0.545.

The value of the dominant wavelength of the (Ca$_{1-x-y}$Ba$_x$Sr$_y$)$_2$Si$_5$N$_8$:Eu$^{2+}$ is preferably located in the range of 596-604 nm at an excitation wavelength of 460 nm. The chromaticity coordinate of the (Ca$_{1-x-y}$Ba$_x$Sr$_y$)$_2$Si$_5$N$_8$:Eu$^{2+}$ preferably has the coordinates L$_{x3}$ and L$_{y3}$ at an excitation wavelength of 460 nm from the following range: 0.608≤L$_{x3}$≤0.639 and 0.360≤L$_{y3}$≤0.390.

The dominant wavelength of the Sr(Sr,Ca)Si$_2$Al$_2$N$_6$:Eu$^{2+}$ luminescent material is preferably located in the range of 596 nm to 604 nm, at an excitation wavelength of 460 nm. The wavelength of maximum intensity of this luminescent material is located in the range of 608 nm to 625 nm. The full width at half maximum of the emission of this luminescent material is less than or equal to 80 nm. The chromaticity coordinate of the radiation emitted by the Sr(Sr,Ca)Si$_2$Al$_2$N$_6$:Eu$^{2+}$ luminescent material is preferably in the range of 0.600≤L$_{x3}$≤0.630 and 0.370≤L$_{y3}$≤0.400, at an excitation wavelength of 460 nm.

By supplying current differently, all the color points within the triangle of the chromaticity coordinates of the individual devices can be actuated. By supplying all the devices with current identically, a chromaticity coordinate having a color temperature of about 4,000 K on the black body curve 1 can be achieved. By exclusively operating the first and second device, the third device 30 not being supplied with current, a chromaticity coordinate having a color temperature of 5,500 K on the black body curve 1 can be achieved.

The color saturation of the first chromaticity coordinate F1 is less than or equal to 48%, that of the second chromaticity coordinate F2 is less than or equal to 30% and that of the third chromaticity coordinate F3 is less than or equal to 81%, each with a deviation of +/−5%.

Figure 4B:
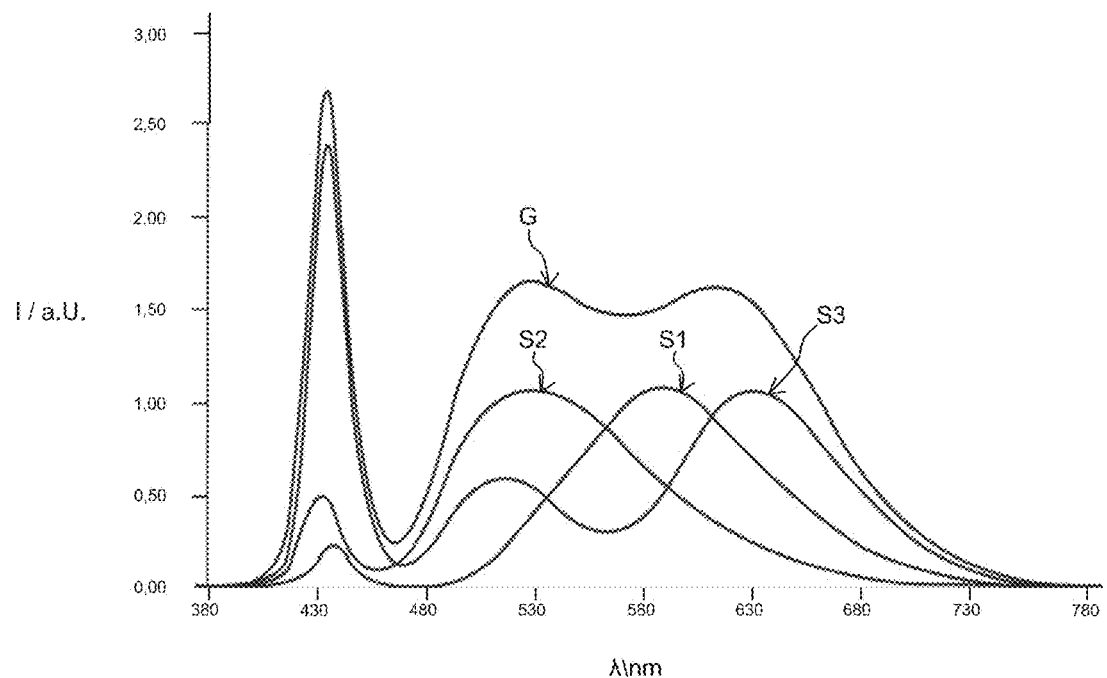

FIG. 4B shows the emission spectra associated with FIG. 4A. The first device 10 has a first total radiation S1 having two peak maxima at about 430 nm and about 530 nm, the second device 20 has a second total radiation S2 having three peak maxima at about 460 nm and about 500 nm and 640 nm and the third device 30 has a third total radiation S3 having two peak maxima at about 450 nm and about 600 nm. The sum of the first, second and third total radiation produces the overall emission G of the arrangement. The overall emission has three peak maxima at about 460 nm, about 520 nm and about 630 nm. The overall emission in the wavelength range of 530 nm to 630 nm has an approximately constant intensity of about 1.5 a.u. with a maximum deviation of 40% from this value.

Figure 5A:
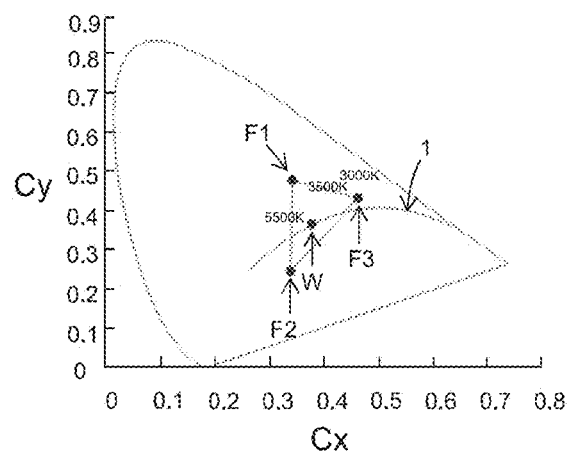

FIG. 5A shows a CIE color diagram having the x-axis $C_x$ and the y-axis $C_y$ according to one embodiment. The chromaticity coordinates F1 to F3 of the respective devices 10, 20 and 30 can be produced by the following arrangement: The first device 10 has a greenish color tone. The color range is preferably located in the range of Cx=0.334 and Cy=0.484 with a deviation of 2 steps of a MacAdam ellipse. For this purpose, it is preferred to use a first luminescent material, $Lu_3(Al_{1-x}Ga_x)_5O_{12}:Ce^{3+}$ where 0<x<1, or a mixture of a plurality of first luminescent materials. The value of the dominant wavelength of the first luminescent material is preferably located in the range of 558-562 nm at an excitation wavelength of 460 nm. The chromaticity coordinate of the first luminescent material preferably has the coordinates $L_{x1}$ and $L_{y1}$ at an excitation wavelength of 460 nm from the following range: $0.356 \leq L_{x1} \leq 0.374$ and $0.561 \leq L_{y1} \leq 0.573$.

The second device 20 has a blue-lilac chromaticity coordinate. The chromaticity coordinate is preferably located in the range of Cx=0.332 and Cy=0.251 with a deviation of 2 steps of a MacAdam ellipse. For this purpose a mixture of second luminescent materials consisting of a $CaAlSiN_3:Eu^{2+}$ with a $Ca_8Mg(SiO_4)_4Cl_2:Eu^{2+}$ is preferably used.

The value of the dominant wavelength of the $CaAlSiN_3:Eu^{2+}$ is preferably located in the range of 641-645 nm at an excitation wavelength of 460 nm. The chromaticity coordinate of the $CaAlSiN_3:Eu^{2+}$ preferably has the coordinates $L_{x2}$ and $L_{y2}$ at an excitation wavelength of 460 nm from the following range: $0.663 \leq L_{x2} \leq 0.675$ and $0.323 \leq L_{y2} \leq 0.333$.

The value of the dominant wavelength of the $Ca_8Mg(SiO_4)_4Cl_2:Eu^{2+}$ is preferably located in the range of 523-529 nm at an excitation wavelength of 460 nm. The chromaticity coordinate of the $Ca_8Mg(SiO_4)_4Cl_2:Eu^{2+}$ preferably has the coordinates $L_{x2}$ and $L_{y2}$ at an excitation wavelength of 460 nm from the following range: $0.200 \leq L_{x2} \leq 0.210$ and $0.630 \leq L_{y2} \leq 0.640$.

The third device 30 has a reddish chromaticity coordinate. The color range is preferably located in the range of Cx=0.457 and Cy=0.437 with a deviation of 2 steps of a MacAdam ellipse. For this purpose, a mixture of two third luminescent materials is preferably used. A $Y_3(Al_{1-x}Ga_x)_5O_{12}:Ce^{3+}$ where 0<x<1 mixed with a $(Ca_{1-x-y}Ba_xSr_y)_2Si_5N_8:Eu^{2+}$ where 0<x<1 and 0<y<1 and/or mixed with an $Sr(Sr,Ca)Si_2Al_2N_6:Eu^{2+}$. The value of the dominant wavelength of the $Y_3(Al_{1-x}Ga_x)_5O_{12}:Ce^{3+}$ is preferably located in the range of 568-575 nm, particularly preferably in the range of 572-575 nm, at an excitation wavelength of 460 nm. The chromaticity coordinate of the $Y_3(Al_{1-x}Ga_x)_5O_{12}:Ce^{3+}$ preferably has the coordinates $L_{x3}$ and $L_{y3}$ at an excitation wavelength of 460 nm from the following range: $0.432 \leq L_{x3} \leq 0.469$ and $0.545 \leq L_{y3} \leq 0.520$.

The value of the dominant wavelength of the $(Ca_{1-x-y}Ba_xSr_y)_2Si_5N_8:Eu^{2+}$ is preferably located in the range of 596-604 nm at an excitation wavelength of 460 nm. The chromaticity coordinate of the $(Ca_{1-x-y}Ba_xSr_y)_2Si_5N_8:Eu^{2+}$ preferably has the coordinates $L_{x3}$ and $L_{y3}$ at an excitation wavelength of 460 nm from the following range: $0.608 \leq L_{x3} \leq 0.639$ and $0.360 \leq L_{y3} \leq 0.390$.

The dominant wavelength of the $Sr(Sr,Ca)Si_2Al_2N_6:Eu^{2+}$ luminescent material is preferably located in the range of 596 nm to 604 nm, at an excitation wavelength of 460 nm. The wavelength of maximum intensity of this luminescent material is located in the range of 608 nm to 625 nm. The full width at half maximum of the emission of this luminescent material is less than or equal to 80 nm. The chromaticity coordinate of the radiation emitted by the $Sr(Sr,Ca)Si_2Al_2N_6:Eu^{2+}$ luminescent material is preferably in the range of $0.600 \leq L_{x3} \leq 0.630$ and $0.370 \leq L_{y3} \leq 0.400$, at an excitation wavelength of 460 nm.

The color saturation of the first chromaticity coordinate F1 is less than or equal to 50%, that of the second chromaticity coordinate F2 is less than or equal to 67% and that of the third chromaticity coordinate F3 is less than or equal to 35%, each with a deviation of +/−5%.

By supplying current differently, all the color points within the triangle of the chromaticity coordinates of the individual devices can be actuated. By supplying all the devices with current identically, a chromaticity coordinate having a color temperature of about 3,750 K on the black body curve 1 is achieved. By exclusively operating the first and second device, the third device 30 not being supplied with current, a chromaticity coordinate having a color temperature of 5,500 K on the black body curve 1 can be achieved. By exclusively operating the second and third device, the first device 10 not being supplied with current, a chromaticity coordinate having a color temperature of 3,000 K on the black body curve 1 can be achieved.

Figure 5B:
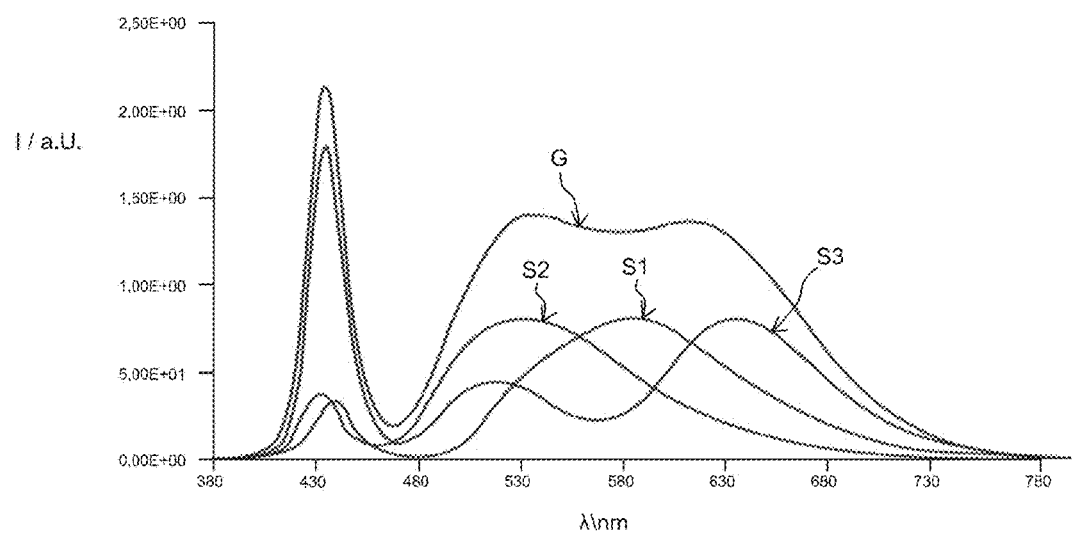

FIG. 5B shows the emission spectra associated with FIG. 5A. The first device 10 has a first total radiation S1 having two peak maxima at about 450 nm and about 530 nm, the second device 20 has a second total radiation S2 having three peak maxima at about 450 nm and about 500 nm and 640 nm and the third device 30 has a third total radiation S3 having two peak maxima at about 440 nm and about 590 nm. The sum of the first, second and third total radiation produces the overall emission G of the arrangement. The overall emission has three peak maxima at about 460 nm, about 520 nm and about 630 nm. The overall emission in the wavelength range of 530 nm to 630 nm has an approximately constant intensity of about 1.2 a.u. with a maximum deviation of 40% from this value.

Figure 6A:
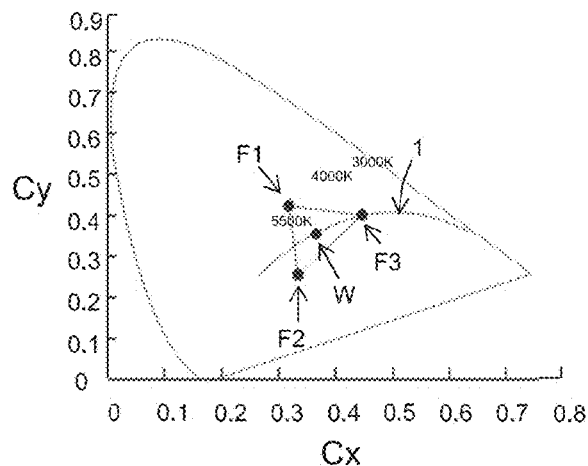

FIG. 6A shows a CIE color diagram having the x-axis $C_x$ and the y-axis $C_y$ according to one embodiment. The chromaticity coordinates F1 to F3 of the respective devices 10, 20 and 30 can be produced by the following arrangement: The first device 10 has a greenish color tone. The color range is preferably located in the range of Cx=0.312 and Cy=0.428 with a deviation of 2 steps of a MacAdam ellipse. For this purpose, it is preferred to use a first luminescent material, $Lu_3(Al_{1-x}Ga_x)_5O_{12}:Ce^{3+}$ where 0<x<1, or a mixture of a plurality of first luminescent materials. The value of the dominant wavelength of the first luminescent material is preferably located in the range of 558-562 nm at an excitation wavelength of 460 nm. The chromaticity coordinate of the first luminescent material preferably has the coordinates $L_{x1}$ and $L_{y1}$ at an excitation wavelength of 460 nm from the following range: $0.356 \leq L_{x1} \leq 0.374$ and $0.561 \leq L_{y1} \leq 0.573$.

The second device 20 has a blue-lilac chromaticity coordinate. The color range is preferably located in the range of Cx=0.328 and Cy=0.262 with a deviation of 2 steps of a MacAdam ellipse. For this purpose, a mixture of second luminescent materials, a $CaAlSiN_3:Eu^{2+}$ with a $Ca_8Mg(SiO_4)_4Cl_2:Eu^{2+}$, is preferably used.

The value of the dominant wavelength of the $CaAlSiN_3:Eu^{2+}$ is preferably located in the range of 641-645 nm at an excitation wavelength of 460 nm. The chromaticity coordinate of the $CaAlSiN_3:Eu^{2+}$ preferably has the coordinates $L_{x2}$ and $L_{y2}$ at an excitation wavelength of 460 nm from the following range: $0.663 \leq L_{x2} \leq 0.675$ and $0.323 \leq L_{y2} \leq 0.333$.

The value of the dominant wavelength of the $Ca_8Mg(SiO_4)_4Cl_2:Eu^{2+}$ is preferably located in the range of 523-529 nm at an excitation wavelength of 460 nm. The chromaticity coordinate of the $Ca_8Mg(SiO_4)_4Cl_2:Eu^{2+}$ preferably has the coordinates $L_{x2}$ and $L_{y2}$ at an excitation wavelength of 460 nm from the following range: $0.200 \leq L_{x2} \leq 0.210$ and $0.630 \leq L_{y2} \leq 0.640$.

The third device 30 has a reddish chromaticity coordinate. The color range is preferably located in the range of Cx=0.438 and Cy=0.407 with a deviation of 2 steps of a MacAdam ellipse. For this purpose, a mixture of two third luminescent materials is preferably used. A $Y_3(Al_{1-x}Ga_x)_5O_{12}:Ce^{3+}$ where $0<x<1$ mixed with a $(Ca_{1-x-y}Ba_xSr_y)_2Si_5N_8:Eu^{2+}$ where $0<x<1$ and $0<y<1$ and/or mixed with an $Sr(Sr,Ca)Si_2Al_2N_6:Eu^{2+}$.

The value of the dominant wavelength of the $Y_3(Al_{1-x}Ga_x)_5O_{12}:Ce^{3+}$ is preferably located in the range of 568-575 nm, particularly preferably in the range of 572-575 nm, at an excitation wavelength of 460 nm. The chromaticity coordinate of the $Y_3(Al_{1-x}Ga_x)_5O_{12}:Ce^{3+}$ preferably has the coordinates $L_{x3}$ and $L_{y3}$ at an excitation wavelength of 460 nm from the following range: $0.432 \leq L_{x3} \leq 0.469$ and $0.520 \leq L_{y3} \leq 0.545$.

The value of the dominant wavelength of the $(Ca_{1-x-y}Ba_xSr_y)_2Si_5N_8:Eu^{2+}$ is preferably located in the range of 596-604 nm at an excitation wavelength of 460 nm. The chromaticity coordinate of the $(Ca_{1-x-y}Ba_xSr_y)_2Si_5N_8:Eu^{2+}$ preferably has the coordinates $L_{x3}$ and $L_{y3}$ at an excitation wavelength of 460 nm from the following range: $0.608 \leq L_{x3} \leq 0.639$ and $0.360 \leq L_{y3} \leq 0.390$.

The dominant wavelength of the $Sr(Sr,Ca)Si_2Al_2N_6:Eu^{2+}$ luminescent material is preferably located in the range of 596 nm to 604 nm, at an excitation wavelength of 460 nm. The wavelength of maximum intensity of this luminescent material is located in the range of 608 nm to 625 nm. The full width at half maximum of the emission of this luminescent material is less than or equal to 80 nm. The chromaticity coordinate of the radiation emitted by the $Sr(Sr,Ca)Si_2Al_2N_6:Eu^{2+}$ luminescent material is preferably in the range of $0.600 \leq L_{x3} \leq 0.630$ and $0.370 \leq L_{y3} \leq 0.400$, at an excitation wavelength of 460 nm.

The color saturation of the first chromaticity coordinate F1 is less than or equal to 25%, that of the second chromaticity coordinate F2 is less than or equal to 55% and that of the third chromaticity coordinate F3 is less than or equal to 30%, each with a deviation of +/−5%.

By supplying current differently, all the color points within the triangle of the chromaticity coordinates of the individual devices can be actuated. By supplying all the devices with current identically, a chromaticity coordinate having a color temperature of about 4,000 K on the black body curve 1 is achieved. By exclusively operating the first and second device, the third device 30 not being supplied with current, a chromaticity coordinate having a color temperature of 5,500 K on the black body curve 1 can be achieved. By exclusively operating the third device, the first and second device 20 not being supplied with current, a chromaticity coordinate having a color temperature of 3,000 K on the black body curve 1 can be achieved.

Figure 6B:
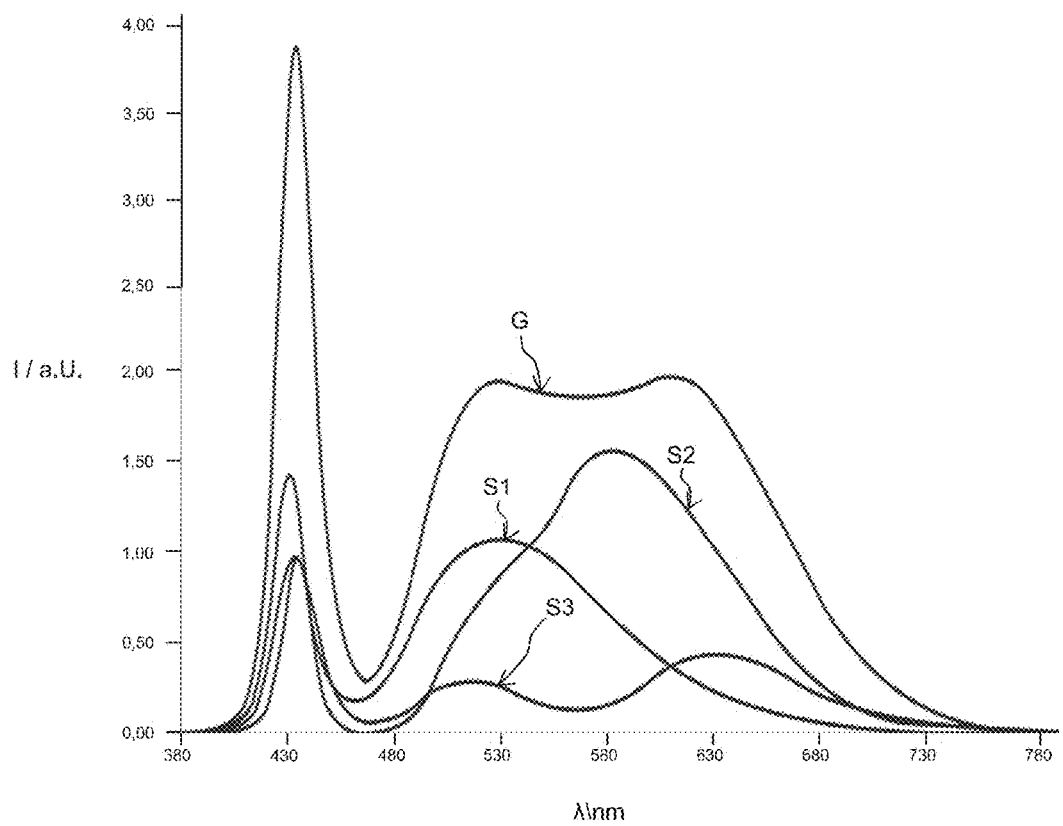

FIG. 6B shows the emission spectra associated with FIG. 6A. The first device 10 has a first total radiation S1 having two peak maxima at about 440 nm and about 530 nm, the second device 20 has a second total radiation S2 having three peak maxima at about 430 nm and about 500 nm and 630 nm and the third device 30 has a third total radiation S3 having two peak maxima at about 430 nm and about 580 nm. The sum of the first, second and third total radiation produces the overall emission G of the arrangement. The overall emission has three peak maxima at about 460 nm, about 530 nm and about 630 nm. The overall emission in the wavelength range of 500 nm to 630 nm has an approximately constant intensity of about 1.7 a.u. with a maximum deviation of 40% from this value.

Figure 7A:
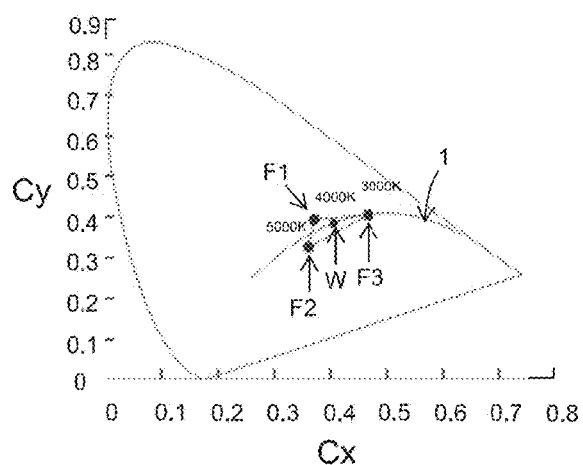

FIG. 7A shows a CIE color diagram having the x-axis $C_x$ and the y-axis $C_y$ according to one embodiment. The chromaticity coordinates F1 to F3 of the respective devices 10, 20 and 30 can be produced by the following arrangement: The first device 10 has a yellowish-white color tone. The color range is preferably located in the range of Cx=0.366 and Cy=0.401 with a deviation of 2 steps of a MacAdam ellipse. For this purpose, it is preferred to use a first luminescent material, $Y_3(Al_{1-x}Ga_x)_5O_{12}:Ce^{3+}$ where $0<x<1$, or a mixture of a plurality of first luminescent materials. The value of the dominant wavelength of the first luminescent material is preferably located in the range of 568-575 nm at an excitation wavelength of 460 nm. The chromaticity coordinate of the first luminescent material preferably has the coordinates $L_{x1}$ and $L_{y1}$ at an excitation wavelength of 460 nm from the following range: $0.432 \leq L_{x1} \leq 0.469$ and $0.545 \leq L_{y1} \leq 0.520$.

The second device 20 has a blue-lilac chromaticity coordinate. The color range is preferably located in the range of Cx=0.357 and Cy=0.334 with a deviation of 2 steps of a MacAdam ellipse. For this purpose, a mixture of second luminescent materials, a $CaAlSiN_3:Eu^{2+}$ with a $Ca_8Mg(SiO_4)_4Cl_2:Eu^{2+}$ is preferably used.

The value of the dominant wavelength of the $CaAlSiN_3:Eu^{2+}$ is preferably located in the range of 641-645 nm at an excitation wavelength of 460 nm. The chromaticity coordinate of the $CaAlSiN_3:Eu^{2+}$ preferably has the coordinates $L_{x2}$ and $L_{y2}$ at an excitation wavelength of 460 nm from the following range: $0.663 \leq L_{x2} \leq 0.675$ and $0.323 \leq L_{y2} \leq 0.333$.

The value of the dominant wavelength of the $Ca_8Mg(SiO_4)_4Cl_2:Eu^{2+}$ is preferably located in the range of 523-529 nm at an excitation wavelength of 460 nm. The chromaticity coordinate of the $Ca_8Mg(SiO_4)_4Cl_2:Eu^{2+}$ preferably has the coordinates $L_{x2}$ and $L_{y2}$ at an excitation wavelength of 460 nm from the following range: $0.200 \leq L_{x2} \leq 0.210$ and $0.630 \leq L_{y2} \leq 0.640$.

The third device 30 has a reddish chromaticity coordinate. The color range is preferably located in the range of Cx=0.462 and Cy=0.412 with a deviation of 2 steps of a MacAdam ellipse. For this purpose, a mixture of two third luminescent materials is preferably used. A $Y_3(Al_{1-x}Ga_x)_5O_{12}:Ce^{3+}$ where $0<x<1$ mixed with a $(Ca_{1-x-y}Ba_xSr_y)_2Si_5N_8:Eu^{2+}$ where $0<x<1$ and $0<y<1$ and/or mixed with an $Sr(Sr,Ca)Si_2Al_2N_6:Eu^{2+}$.

The value of the dominant wavelength of the $Y_3(Al_{1-x}Ga_x)_5O_{12}:Ce^{3+}$ is preferably located in the range of 568-575 nm, particularly preferably in the range of 572-575 nm, at an excitation wavelength of 460 nm. The chromaticity coordinate of the $Y_3(Al_{1-x}Ga_x)_5O_{12}:Ce^{3+}$ preferably has the coordinates $L_{x3}$ and $L_{y3}$ at an excitation wavelength of 460 nm from the following range: $0.432 \leq L_{x3} \leq 0.469$ and $0.545 \leq L_{y3} \leq 0.520$.

The value of the dominant wavelength of the $(Ca_{1-x-y}Ba_xSr_y)_2Si_5N_8:Eu^{2+}$ is preferably located in the range of 596-604 nm at an excitation wavelength of 460 nm. The chromaticity coordinate of the $(Ca_{1-x-y}Ba_xSr_y)_2Si_5N_8:Eu^{2+}$ preferably has the coordinates $L_{x3}$ and $L_{y3}$ at an excitation wavelength of 460 nm from the following range: $0.608 \leq L_{x3} \leq 0.639$ and $0.360 \leq L_{y3} \leq 0.390$.

The dominant wavelength of the $Sr(Sr,Ca)Si_2Al_2N_6:Eu^{2+}$ luminescent material is preferably located in the range of 596 nm to 604 nm, at an excitation wavelength of 460 nm. The wavelength of maximum intensity of this luminescent material is located in the range of 608 nm to 625 nm. The full width at half maximum of the emission of this luminescent material is less than or equal to 80 nm. The chromaticity coordinate of the radiation emitted by the $Sr(Sr,Ca)Si_2Al_2N_6:Eu^{2+}$ luminescent material is preferably in the range of $0.600 \leq L_{x3} \leq 0.630$ and $0.370 \leq L_{y3} \leq 0.400$, at an excitation wavelength of 460 nm.

The color saturation of the first chromaticity coordinate F1 is less than or equal to 35%, that of the second chromaticity coordinate F2 is less than or equal to 10% and that of the third chromaticity coordinate F3 is less than or equal to 75%, each with a deviation of +/−5%.

By supplying current differently, all the color points within the triangle spanned by the chromaticity coordinates F1, F2 and F3 within the CIE color diagram can be actuated. By supplying all the devices with current identically, a chromaticity coordinate having a color temperature of about 3,500 K on the black body curve 1 is achieved. By exclusively operating the first and second device, the third device 30 not being supplied with current, a chromaticity coordinate having a color temperature of 5,000 K on the black body curve 1 can be achieved. Owing to the chromaticity coordinates of the individual devices being close on the black body curve 1, a high lumen value can be achieved.

Figure 7B:
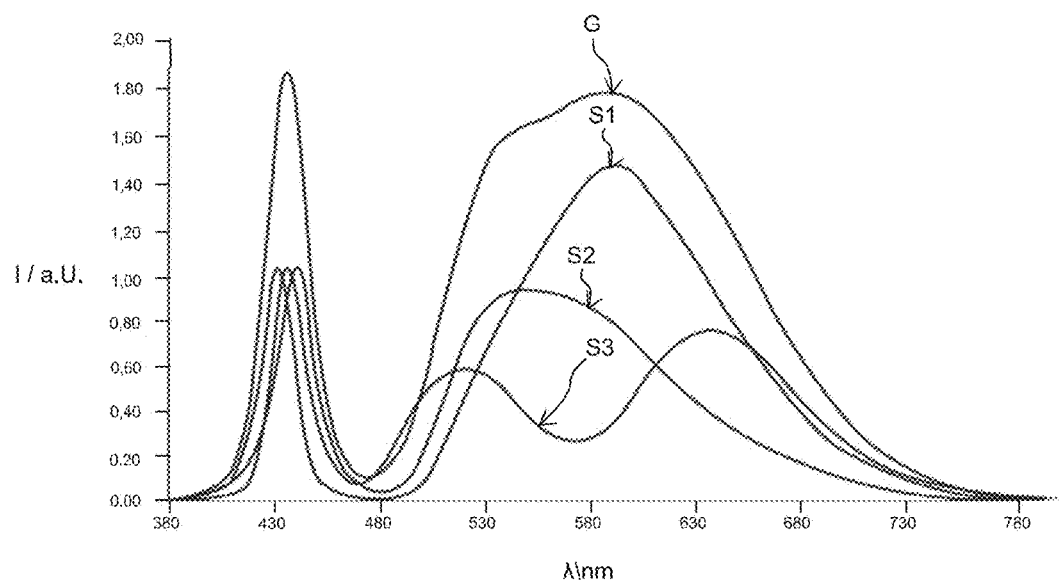

FIG. 7B shows the emission spectra associated with FIG. 7A. The first device 10 has a first total radiation S1 having two peak maxima at about 440 nm and about 550 nm, the second device 20 has a second total radiation S2 having three peak maxima at about 450 nm and about 500 nm and 640 nm and the third device 30 has a third total radiation S3 having two peak maxima at about 440 nm and about 590 nm. The sum of the first, second and third total radiation produces the overall emission G of the arrangement. The overall emission has two peak maxima at about 460 nm and about 600 nm. The overall emission in the wavelength range of 530 nm to 630 nm has an approximately constant intensity of about 1.55 a.u. with a maximum deviation of 40% from this value.

FIG. 8A shows a CIE color diagram having the x-axis $C_x$ and the y-axis $C_y$ according to one embodiment. The chromaticity coordinates F1 to F3 of the respective devices 10, 20 and 30 can be produced by the following arrangement: The first device 10 has a white color tone. The color range is preferably located in the range of Cx=0.345 and Cy=0.353 with a deviation of 2 steps of a MacAdam ellipse. For this purpose, a first luminescent material of composition $Y_3(Al_{x-1}Ga_x)_5O_{12}:Ce^{3+}$ where 0<x<1 is preferably used, or a mixture of a plurality of first luminescent materials which have, for example, a different cerium concentration and/or x value. The dominant wavelength of the first luminescent material preferably has a value in the range of 572-575 nm at an excitation wavelength of 460 nm. At an excitation wavelength of 460 nm, the chromaticity coordinate of the first luminescent material has the coordinates $L_{x1}$ and $L_{y1}$ from the following range: $0.460 \leq L_{x1} \leq 0.472$ and $0.528 \leq L_{y1} \leq 0.518$.

Optionally, the chromaticity coordinate can be adapted by admixing e.g. a proportion of less than 10% of a red- or green-emitting further luminescent material.

The second device 20 has a reddish-lilac chromaticity coordinate. The color range is preferably located in the range of Cx=0.438 and Cy=0.321 with a deviation of 2 steps of a MacAdam ellipse. For this purpose, second luminescent materials, in particular a mixture of a $(Ca_{1-x-y}Ba_xSr_y)_2Si_5N_8:Eu^{2+}$ where 0<x<1 and 0<y<1 and/or an $Sr(Sr,Ca)Si_2Al_2N_6:Eu^{2+}\%$ with an $Lu_3(Al_{1-x}Ga_x)_5O_{12}:Ce^{3+}$ where 0<x<1 are preferably used, or a mixture of a plurality of $Lu_3(Al_{1-x}Ga_x)_5O_{12}: Ce^{3+}$-luminescent materials, wherein the proportion of x and/or the cerium concentration in the $Lu_3(Al_{1-x}Ga_x)_5O_{12}: Ce^{3+}$ can be varied.

The value of the dominant wavelength of the $Lu_3(Al_{1-x}Ga_x)_5O_{12}:Ce^{3+}$ is preferably located in the range of 558-562 nm at an excitation wavelength of 460 nm. The chromaticity coordinate of the second luminescent material $Lu_3(Al_{1-x}Ga_x)_5O_{12}:Ce^{3+}$ preferably has the coordinates $L_{x2}$ and $L_{y2}$ at an excitation wavelength of 460 nm from the following range: $0.356 \leq L_{x2} \leq 0.374$ and $0.561 \leq L_{y2} \leq 0.573$.

The value of the dominant wavelength of the $(Ca_{1-x-y}Ba_xSr_y)_2Si_5N_8:Eu^{2+}$ is preferably located in the range of 596-604 nm at an excitation wavelength of 460 nm. The chromaticity coordinate of the $(Ca_{1-x-y}Ba_xSr_y)_2Si_5N_8:Eu^{2+}$ preferably has the coordinates $L_{x2}$ and $L_{y2}$ at an excitation wavelength of 460 nm from the following range: $0.608 \leq L_{x2} \leq 0.639$ and $0.360 \leq L_{y2} \leq 0.390$.

The dominant wavelength of the $Sr(Sr,Ca)Si_2Al_2N_6:Eu^{2+}$ luminescent material is preferably located in the range of 596 nm to 604 nm, at an excitation wavelength of 460 nm. The wavelength of maximum intensity of this luminescent material is located in the range of 608 nm to 625 nm. The full width at half maximum of the emission of this luminescent material is less than or equal to 80 nm. The chromaticity coordinate of the radiation emitted by the $Sr(Sr,Ca)Si_2Al_2N_6:Eu^{2+}$ luminescent material is preferably in the range of $0.600 \leq L_{x2} \leq 0.630$ and $0.370 \leq L_{y2} \leq 0.400$, at an excitation wavelength of 460 nm. Such a luminescent material can also be provided, in all the other exemplified embodiments, additionally or alternatively as a second luminescent material or in the mixture for the second luminescent material.

The third device 30 has a reddish chromaticity coordinate. The color range is preferably located in the range of Cx=0.430 and Cy=0.470 with a deviation of 2 steps of a MacAdam ellipse. For this purpose, a mixture of two third luminescent materials is preferably used. A $Y_3(Al_{1-x}Ga_x)_5O_{12}:Ce^{3+}$ where 0<x<1 mixed with a $(Ca_{1-x-y}Ba_xSr_y)_2Si_5N_8:Eu^{2+}$ where 0<x<1 and 0<y<1 and/or mixed with an $Sr(Sr,Ca)Si_2Al_2N_6:Eu^{2+}$ is used.

The value of the dominant wavelength of the $Y_3(Al_{1-x}Ga_x)_5O_{12}:Ce^{3+}$ is preferably located in the range of 568-575 nm, particularly preferably in the range of 572-575 nm, at an excitation wavelength of 460 nm. The chromaticity coordinate of the $Y_3(Al_{1-x}Ga_x)_5O_{12}:Ce^{3+}$ preferably has the coordinates $L_{x3}$ and $L_{y3}$ at an excitation wavelength of 460 nm from the following range: $0.432 \leq L_{x3} \leq 0.469$ and $0.545 \leq L_{y3} \leq 0.520$.

The value of the dominant wavelength of the $(Ca_{1-x-y}Ba_xSr_y)_2Si_5N_8:Eu^{2+}$ is preferably located in the range of 596-604 nm at an excitation wavelength of 460 nm. The chromaticity coordinate of the $(Ca_{1-x-y}Ba_xSr_y)_2Si_5N_8:Eu^{2+}$ preferably has the coordinates $L_{x3}$ and $L_{y3}$ at an excitation wavelength of 460 nm from the following range: $0.608 \leq L_{x3} \leq 0.639$ and $0.360 \leq L_{y3} \leq 0.390$.

The dominant wavelength of the $Sr(Sr,Ca)Si_2Al_2N_6:Eu^{2+}$ luminescent material is preferably located in the range of 596 nm to 604 nm, at an excitation wavelength of 460 nm. The wavelength of maximum intensity of this luminescent material is located in the range of 608 nm to 625 nm. The full width at half maximum of the emission of this luminescent material is less than or equal to 80 nm. The chromaticity coordinate of the radiation emitted by the $Sr(Sr,Ca)Si_2Al_2N_6:Eu^{2+}$ luminescent material is preferably in the range of $0.600 \leq L_{x3} \leq 0.630$ and $0.370 \leq L_{y3} \leq 0.400$, at an excitation wavelength of 460 nm.

The color saturation of the first chromaticity coordinate F1 is less than or equal to 15%, that of the second chromaticity coordinate F2 is less than or equal to 35% and that of the third chromaticity coordinate F3 is less than or equal to 73%, each with a deviation of +/−5%.

By supplying current differently, all the color points within the triangle of chromaticity coordinates F1 to F3 of the individual devices can be actuated. By supplying all the devices with current identically, a chromaticity coordinate at a color temperature of about 3,500 K on the black body curve 1 is achieved.

By operating just the first device, a chromaticity coordinate having a color temperature of about 5,500 K on the black body curve 1 is achieved. By operating the second and third devices by supplying them with current in an identical or very similar manner, a chromaticity coordinate having a color temperature of about 3,000 K on the black body curve 1 is achieved. With such an embodiment, chromaticity coordinates on the black body curve 1 having a color temperature of 5,500 K to 3,000 K can thus be achieved.

FIG. 8B shows the emission spectra associated with FIG. 8A which can belong to the corresponding chromaticity coordinates F1 to F3 of the devices. The first device 10 has a first total radiation S1 having two peak maxima at about 460 nm and about 550 nm, the second device 20 has a second total radiation S2 having two peak maxima at about 460 nm and about 610 nm and the third device 30 has a third total radiation S3 having two peak maxima at about 460 nm and about 560 nm. The respective total radiation is produced from the respective primary radiation and secondary radiation. The sum of the first, second and third total radiation produces the overall emission G of the arrangement. The overall emission has two peak maxima at about 460 nm and about 600 nm.

FIG. 9A shows a CIE color diagram having the x-axis $C_x$ and the y-axis $C_y$ according to one embodiment. The chromaticity coordinates F1 to F3 of the respective devices 10, 20 and 30 can be produced by the following arrangement: The first device 10 has a white color tone. The color range is preferably located in the range of Cx=0.345 and Cy=0.353 with a deviation of 2 steps of a MacAdam ellipse. For this purpose, a first luminescent material $Y_3(Al_{1-x}Ga_x)_5O_{12}:Ce^{3+}$ where $0<x<1$ is preferably used, or a mixture of a plurality of first luminescent materials, such as $Y_3(Al_{1-x}Ga_x)_5O_{12}:Ce^{3+}$ where $0<x<1$, wherein the $Y_3(Al_{1-x}Ga_x)_5O_{12}:Ce^{3+}$ luminescent materials differ from each other, for example, in the x value and/or cerium concentration.

The value of the dominant wavelength of the first luminescent material is preferably located in the range of 572-575 nm at an excitation wavelength of 460 nm. The chromaticity coordinate of the first luminescent material preferably has the coordinates $L_{x1}$ and $L_{y1}$ at an excitation wavelength of 460 nm from the following range: $0.460 \leq L_{x1} \leq 0.472$ and $0.518 \leq L_{y1} \leq 0.528$.

Optionally, the chromaticity coordinate can be adapted by admixing (<10% proportion) of a red- or green-emitting luminescent material.

The second device 20 has a reddish-lilac chromaticity coordinate. The color range is preferably located in the range of Cx=0.440 and Cy=0.320 with a deviation of 2 steps of a MacAdam ellipse. For this purpose, second luminescent materials, in particular a mixture of $CaAlSiN_3:Eu^{2+}$ and $Ca_8Mg(SiO_4)_4Cl_2:Eu^{2+}$ or a mixture of $Sr(Sr,Ca)Si_2Al_2N_6:Eu^{2+}$ and $Ca_8Mg(SiO_4)_4Cl_2:Eu^{2+}$ is preferably used.

The value of the dominant wavelength of the $CaAlSiN_3:Eu^{2+}$ is preferably located in the range of 641-645 nm at an excitation wavelength of 460 nm. At an excitation wavelength of 460 nm, the chromaticity coordinate of the $CaAlSiN_3:Eu^{2+}$ has the coordinates $L_{x2}$ and $L_{y2}$ from the following range: $0.663 \leq L_{x2} \leq 0.675$ and $0.323 \leq L_{y2} \leq 0.333$.

The value of the dominant wavelength of the $Ca_8Mg(SiO_4)_4Cl_2:Eu^{2+}$ is preferably located in the range of 523-529 nm at an excitation wavelength of 460 nm. At an excitation wavelength of 460 nm, the chromaticity coordinate of the $Ca_8Mg(SiO_4)_4Cl_2:Eu^{2+}$ has the coordinates $L_{x2}$ and $L_{y2}$ from the following range: $0.200 \leq L_{x2} \leq 0.210$ and $0.630 \leq L_{y2} \leq 0.640$.

The dominant wavelength of the $Sr(Sr,Ca)Si_2Al_2N_6:Eu^{2+}$ luminescent material is preferably located in the range of 596 nm to 604 nm, at an excitation wavelength of 460 nm. The wavelength of maximum intensity of this luminescent material is located in the range of 608 nm to 625 nm. The full width at half maximum of the emission of this luminescent material is less than or equal to 80 nm. The chromaticity coordinate of the radiation emitted by the $Sr(Sr,Ca)Si_2Al_2N_6:Eu^{2+}$ luminescent material is preferably in the range of $0.600 \leq L_{x2} \leq 0.630$ and $0.370 \leq L_{y2} \leq 0.400$, at an excitation wavelength of 460 nm.

The third device 30 has a reddish chromaticity coordinate. The color range is preferably located in the range of Cx=0.430 and Cy=0.470 with a deviation of steps of a MacAdam ellipse. For this purpose, a mixture of two third luminescent materials is preferably used. A $Y_3(Al_{1-x}Ga_x)_5O_{12}:Ce^{3+}$ where $0<x<1$ mixed with a $(Ca_{1-x-y}Ba_xSr_y)_2Si_5N_8:Eu^{2+}$ where $0<x<1$ and $0<y<1$ and/or mixed with an $Sr(Sr,Ca)Si_2Al_2N_6:Eu^{2+}$.

The value of the dominant wavelength of the $Y_3(Al_{1-x}Ga_x)_5O_{12}:Ce^{3+}$ is preferably located in the range of 568-575 nm, particularly preferably in the range of 572-575 nm, at an excitation wavelength of 460 nm. At an excitation wavelength of 460 nm, the chromaticity coordinate of the $Y_3(Al_{1-x}Ga_x)_5O_{12}:Ce^{3+}$ preferably has the coordinates $L_{x3}$ and $L_{y3}$ from the following range: $0.432 \leq L_{x3} \leq 0.469$ and $0.520 \leq L_{y3} \leq 0.545$.

The value of the dominant wavelength of the $(Ca_{1-x-y}Ba_xSr_y)_2Si_5N_8:Eu^{2+}$ is preferably located in the range of 596-604 nm at an excitation wavelength of 460 nm. At an excitation wavelength of 460 nm, the chromaticity coordinate of the $(Ca_{1-x-y}Ba_xSr_y)_2Si_5N_8:Eu^{2+}$ preferably has the coordinates $L_{x3}$ and $L_{y3}$ from the following range: $0.608 \leq L_{x3} \leq 0.639$ and $0.360 \leq L_{y3} \leq 0.390$.

The dominant wavelength of the $Sr(Sr,Ca)Si_2Al_2N_6:Eu^{2+}$ luminescent material is preferably located in the range of 596 nm to 604 nm, at an excitation wavelength of 460 nm. The wavelength of maximum intensity of this luminescent material is located in the range of 608 nm to 625 nm. The full width at half maximum of the emission of this luminescent material is less than or equal to 80 nm. The chromaticity coordinate of the radiation emitted by the $Sr(Sr,Ca)Si_2Al_2N_6:Eu^{2+}$ luminescent material is preferably in the range of $0.600 \leq L_{x3} \leq 0.630$ and $0.370 \leq L_{y3} \leq 0.400$, at an excitation wavelength of 460 nm.

The color saturation of the first chromaticity coordinate F1 is less than or equal to 15%, that of the second chromaticity coordinate F2 is less than or equal to 30% and that of the third chromaticity coordinate F3 is less than or equal to 75%, each with a deviation of +/−5%.

By supplying the devices with current differently, all the color points within the triangle of chromaticity coordinates F1, F2 and F3 of the individual devices can be actuated. The arrangement can have a chromaticity coordinate W having the coordinates Cx=0.400 and Cy=0.350. By supplying all the devices with current identically, a chromaticity coordinate having a color temperature of about 3,500 K on the black body curve 1 is achieved. By exclusively operating the first device, a chromaticity coordinate having a color temperature of about 5,500 K on the black body curve 1 is achieved. By operating the second and third devices by supplying them with current in an identical or very similar manner, a chromaticity coordinate having a color temperature of about 3,000 K on the black body curve 1 is achieved. With such an embodiment, chromaticity coordinates on the black body curve 1 having a color temperature of 5,500 K to 3,000 K can thus be achieved.

FIG. 9B shows the emission spectra associated with FIG. 9A. The first device 10 has a first total radiation S1 having two peak maxima at about 460 nm and about 550 nm, the second device 20 has a second total radiation S2 having three peak maxima at about 460 nm and about 520 nm and 640 nm and the third device 30 has a third total radiation S3 having two peak maxima at about 460 nm and about 560 nm. The sum of the first, second and third total radiation produces the overall emission G of the arrangement. The overall emission has three peak maxima at about 460 nm, about 530 nm and about 630 nm. The overall emission in the wavelength range of 530 nm to 630 nm has an approximately constant intensity of about 2.0 a.u. with a maximum deviation of 40% from this value, wherein this arrangement is particularly suitable for flash light applications.

FIG. 10 shows a schematic side view of an arrangement for generating mixed light. The arrangement comprises a carrier 40. The carrier 40 can consist in particular of metal. A first device 10, a second device 20 and a third device 30 are arranged in direct mechanical contact on the carrier 40. The first device 10 includes a first semiconductor chip 11 and a first conversion element 13 arranged thereon. The first semiconductor chip 11 is configured to emit a first primary radiation 12, wherein the first conversion element 13 is configured to convert the first primary radiation 12 into a first secondary radiation 14. The second device 20 includes a second semiconductor chip 21 which is configured to generate a second primary radiation 22 in the blue spectral range. Arranged directly thereon is a second conversion element 23 which is configured to convert the second primary radiation 22 into a second secondary radiation 24. The third device 30 comprises a third semiconductor chip 31 and a third conversion element 33 arranged thereon. The third semiconductor chip 31 emits a third primary radiation 32, wherein the third conversion element 33 converts this primary radiation into a third secondary radiation 34. The three devices are arranged in a recess 70 of a housing 50. A common lens 60 is located above the devices. The primary and secondary radiations exiting the corresponding devices can be mixed in this lens and therefore exit the device as an overall emission G.

FIG. 11 shows a schematic side view of an arrangement for generating mixed light according to one embodiment. FIG. 11 differs from FIG. 10 in that the individual devices are separated from each other by a separation 80. In other words, the first device 10 is spatially separated from the second device 20 and from the third device 30. The same is true for the second device 20 and the third device 30. In contrast to FIG. 10, the arrangement in FIG. 11 does not have a common lens, but has particles in a casting compound of the recess 70 which scatter the electromagnetic primary radiation and/or secondary radiation. Owing to the separation 80, the respective primary radiations and secondary radiations of the respective devices are not mixed. The total radiations S1, S2 and S3 can then exit the arrangement separately. Alternatively, the total radiations can be mixed in a lens arranged downstream in the beam path.

FIG. 12 shows a schematic side view of an arrangement according to one embodiment. The arrangement according to FIG. 12 differs from the arrangement according to FIG. 10 in that the respective conversion elements of the individual devices 10, 20 and 30 are not formed as a layer and arranged directly on the respective semiconductor chip, as in FIG. 10, but are embedded in a casting compound as particles.

FIG. 13 shows a CIE color diagram having the x-axis Cx and the y-axis Cy according to one embodiment. The chromaticity coordinates of the respective total radiations of the respective devices 10, 20 and 30 of all the previously mentioned exemplified embodiments are shown in the CIE color diagram. The first device 10 has a first chromaticity coordinate which lies within a color quadrilateral having the corner points (0.285, 0.345), (0.285, 0.500), (0.390, 0.500) and (0.390, 0.345). In particular, the first chromaticity coordinate of the first device lies within a color quadrilateral having the corner points (0.300, 0.425), (0.308, 0.439), (0.388, 0.407) and (0.370, 0.390) and/or (0.322, 0.482), (0.330, 0.500), (0.384, 0.450) and (0.375, 0.432) and/or (0.335, 0.345), (0.335, 0.365), (0.355, 0.365) and (0.355, 0.345).

The second device 20 has a second chromaticity coordinate which lies within a color quadrilateral having the coordinates (0.300, 0.225), (0.375, 0.225), (0.300, 0.340) and (0.475, 0.340). In particular, the second chromaticity coordinate lies within a color quadrilateral having the coordinates (0.325, 0.225), (0.350, 0.225), (0.350, 0.275) and (0.325, 0.275) and/or within a color quadrilateral having the coordinates (0.350, 0.325), (0.365, 0.325), (0.350, 0.340) and (0.365, 0.340) and/or within a color quadrilateral having the coordinates (0.445, 0.309), (0.457, 0.318), (0.425, 0.325) and (0.439, 0.337).

The third device 30 has a third chromaticity coordinate which lies within a color quadrilateral having the coordinates (0.425, 0.400), (0.525, 0.400), (0.425, 0.485) and (0.525, 0.450). In particular, the third chromaticity coordinate lies within a color quadrilateral having the coordinates (0.475, 0.400), (0.425, 0.400), (0.425, 0.440) and (0.475, 0.440) and/or within a color quadrilateral having the coordinates (0.515, 0.420), (0.495, 0.420), (0.515, 0.450) and (0.495, 0.450) and/or within a color quadrilateral having the coordinates (0.425, 0.465), (0.425, 0.475), (0.440, 0.475) and (0.440, 0.465).

The invention is not limited by the description using the exemplified embodiments; rather, the invention includes any new feature and any combination of features, including in particular any combination of features in the claims, even if this feature or this combination is not itself explicitly indicated in the claims or exemplified embodiments.

This patent application claims priority from German patent application 10 2013 106 519.8, the disclosure content of which is hereby incorporated by reference.

The invention claimed is:

1. An arrangement for generating mixed light, comprising:
   a first device;
   a second device; and
   a third device,
   the first device having a first semiconductor chip for generating a first primary radiation in the blue spectral range and having a first conversion element for generating a first secondary radiation from the first primary radiation, wherein a first total radiation exiting the first device has a first chromaticity coordinate, which lies within a color quadrilateral having the corner points (0.300, 0.425), (0.308, 0.439), (0.388, 0.407) and (0.370, 0.390) or (0.322, 0.482), (0.330, 0.500), (0.384, 0.450) and (0.375, 0.432) or (0.335, 0.345), (0.335, 0.365), (0.355, 0.365) and (0.355, 0.345),
   the second device having a second semiconductor chip for generating a second primary radiation in the blue spectral range and having a second conversion element for generating a second secondary radiation from the second primary radiation, wherein a second total radiation exiting the second device has a second chromaticity coordinate, which lies within a color quadrilateral having the corner points (0.325, 0.225), (0.350, 0.225), (0.350, 0.275) and (0.325, 0.275) or (0.350, 0.325), (0.365, 0.325), (0.350, 0.340) and (0.365, 0.340) or (0.445, 0.309), (0.457, 0.318), (0.425, 0.325) and (0.439, 0.337), and
   the third device having a third semiconductor chip for generating a third primary radiation in the blue spectral range and having a third conversion element for generating a third secondary radiation from the third primary radiation, wherein a third total radiation exiting the third device has a third chromaticity coordinate, which lies within a color quadrilateral having the corner points (0.475, 0.400), (0.425, 0.400), (0.425, 0.440) and (0.475, 0.440) or (0.515, 0.420), (0.495, 0.420), (0.515, 0.450) and (0.495, 0.450) or (0.425, 0.465), (0.425, 0.475), (0.440, 0.475) and (0.440, 0.465).

2. The arrangement according to claim 1, wherein the first conversion element includes a first luminescent material which is a doped aluminum gallium oxide, and/or
   wherein the second conversion element includes a second luminescent material which is doped silicon oxynitride, silicon nitride, aluminum gallium oxide, aluminum silicon nitride and/or chlorosilicate, and/or
   wherein the third conversion element includes a third luminescent material which is doped aluminum gallium oxide, aluminum silicon nitride and/or silicon nitride.

3. The arrangement according to claim 1, wherein the first conversion element includes a first luminescent material which is a doped aluminum gallium oxide, wherein the second conversion element includes a second luminescent material which is doped silicon oxynitride, silicon nitride, aluminum gallium oxide, aluminum silicon nitride and/or chlorosilicate,
   wherein the third conversion element includes a third luminescent material, which is $Sr(Sr,Ca)Si_2Al_2N_6:Eu^{2+}$,
   wherein the first chromaticity coordinate lies in a color quadrilateral having the corner points (0.300, 0.425), (0.308, 0.439), (0.388, 0.407) and (0.370, 0.390) and/or (0.322, 0.482), (0.330, 0.500), (0.384, 0.450) and (0.375, 0.432) and/or (0.335, 0.345), (0.335, 0.365), (0.355, 0.365) and (0.355, 0.345),
   wherein the second chromaticity coordinate lies in a color quadrilateral having the corner points (0.325, 0.225), (0.350, 0.225), (0.350, 0.275) and (0.325, 0.275) and/or (0.350, 0.325), (0.365, 0.325), (0.350, 0.340) and (0.365, 0.340) and/or (0.445, 0.309), (0.457, 0.318), (0.425, 0.325) and (0.439, 0.337), and
   wherein the third chromaticity coordinate lies in a color quadrilateral having the corner points (0.475, 0.400), (0.425, 0.400), (0.425, 0.440) and (0.475, 0.440) and/or (0.515, 0.420), (0.495, 0.420), (0.515, 0.450) and (0.495, 0.450) and/or (0.425, 0.465), (0.425, 0.475), (0.440, 0.475) and (0.440, 0.465).

4. The arrangement according to claim 1, which consists of the first, second and third device, wherein one device partially converts primary radiation into secondary radiation and two devices fully convert primary radiation into secondary radiation, or wherein two devices partially convert primary radiation into secondary radiation and one device fully converts primary radiation into secondary radiation.

5. The arrangement according to claim 1, wherein the first, second and third devices are configured such that the generation of the respective primary radiation in each of the first, second and third devices can be independently controlled.

6. The arrangement according to claim 1, which has an overall emission having an intensity consisting of the first, second and third total radiations, the intensity of which being constant in the wavelength range of 500 nm to 650 nm with a deviation of +/−40%.

7. The arrangement according to claim 1, wherein the first, second and/or third chromaticity coordinate has a color saturation of less than or equal to 82%.

8. The arrangement according to claim 1, wherein the first, second or third chromaticity coordinate has a color saturation of less than or equal to 50%.

9. The arrangement according to claim 1, wherein the first, second and third devices are arranged in a housing, wherein a common lens is arranged in the beam path of the first, second and third total radiation, which lens is configured to mix the first, second and third total radiations.

10. The arrangement according to claim 1, wherein the first, second and third devices are spaced apart from each other so that the first, second and third conversion elements do not contact each other.

11. The arrangement according to claim 1, wherein the first conversion element having at least one first luminescent material fully converts the first primary radiation into a first secondary radiation,
   wherein the first luminescent material is selected from the following group and combinations thereof and has a chromaticity coordinate having the coordinates $L_{x1}$, $L_{y1}$, and
   wherein $L_{x1}$ and $L_{y1}$ are selected from the following ranges:
   $Y_3(Al_{1-x}Ga_x)_5O_{12}:Ce^{3+}$ where $0<x<1$ and $0.432 \le L_{x1} \le 0.469$ and $0.520 \le L_{y1} \le 0.545$,
   $Y_3(Al_{1-x}Ga_x)_5O_{12}:Ce^{3+}$ where $0<x<1$ and $0.453 \le L_{x1} \le 0.469$ and $0.532 \le L_{y1} \le 0.520$, and
   $Lu_3(Al_{1-x}Ga_x)_5O_{12}:Ce^{3+}$ where $0<x<1$ and $0.356 \le L_{x1} \le 0.374$ and $0.561 \le L_{y1} \le 0.573$.

12. The arrangement according to claim 1, wherein the second conversion element having at least one second luminescent material fully converts the second primary radiation into a second secondary radiation, wherein the second luminescent material is selected from the following group and combinations thereof and has a chromaticity coordinate having the coordinates $L_{x2}$, $L_{y2}$, and wherein $L_{x2}$ and $L_{y2}$ are selected from the following ranges:

$Lu_3(Al_{1-x}Ga_x)_5O_{12}:Ce^{3+}$ where $0<x<1$ and $0.356 \leq L_{x2} \leq 0.374$ and $0.561 \leq L_{y2} \leq 0.573$, $(Ba_{1-x}Sr_x)Si_2O_2N_2:Eu^{2+}$ where $0<x<1$ and $0.428 \leq L_{x2} \leq 0.431$ and $0.555 \leq L_{y2} \leq 0.553$, $CaAlSiN_3:Eu^{2+}$ where $0.663 \leq L_{x2} \leq 0.675$ and $0.323 \leq L_{y2} \leq 0.333$, $Ca_8Mg(SiO_4)_4Cl_2:Eu^{2+}$ where $0.2000 \leq L_{x2} \leq 0.210$ and $0.630 \leq L_{y2} \leq 0.640$, $(Ca_{1-x-y}Ba_xSr_y)_2Si_5N_8:Eu^{2+}$ where $0<x<1$ and $0<y<1$ and $0.608 \leq L_{x3} \leq 0.639$ and $0.360 \leq L_{y3} \leq 0.390$, and $Sr(Sr_aCa_{1-a})Si_2Al_2N_6:Eu^{2+}$ where $0.6<a \leq 0.98$ and $0.600 \leq L_2 \leq 0.630$ and $0.370 \leq L_{y2} \leq 0.400$.

13. The arrangement according to claim 1, wherein the third conversion element having at least one third luminescent material fully converts the third primary radiation into a third secondary radiation, wherein the third luminescent material is selected from the following group and combinations thereof and has a chromaticity coordinate having the coordinates $L_{x3}$, $L_{y3}$, and wherein $L_{x3}$ and $L_{y3}$ are selected from the following ranges:

$Y_3(Al_{1-x}Ga_x)_5O_{12}:Ce^{3+}$ where $0<x<1$ and $0.432 \leq L_{x3} \leq 0.469$ and $0.520 \leq L_{y3} \leq 0.545$, $CaAlSiN_3:Eu^{2+}$ where $0.608 \leq L_{x3} \leq 0.639$ and $0.360 \leq L_{y3} \leq 0.390$, $(Ca_{1-x-y}Ba_xSr_y)_2Si_5N_8:Eu^{2+}$ where $0<x<1$ and $0<y<1$ and $0.608 \leq L_{x3} \leq 0.639$ and $0.360 \leq L_{y3} \leq 0.390$, and $Sr(Sr_aCa_{1-a})Si_2Al_2N_6:Eu^{2+}$ where $0.6<a \leq 0.98$ and $0.600 \leq L_{x3} \leq 0.630$ and $0.370 \leq L_{y3} \leq 0.400$.

14. The arrangement according to claim 1, wherein the first and second and third primary radiations are selected from a wavelength range of 420 nm to 490 nm.

15. The arrangement according to claim 1, for generating white mixed light for flash light applications.

16. A method for operating an arrangement of mixed light according to claim 1, wherein the first, second and third devices are actuated at different times and/or sequentially.

17. A method for operating an arrangement of mixed light according to claim 1, wherein the first, second and third devices are actuated at the same time with a constant current intensity.

* * * * *